United States Patent
Sugawara et al.

(10) Patent No.: US 8,138,004 B2
(45) Date of Patent: Mar. 20, 2012

(54) PHOTOELECTRIC CONVERSION DEVICE, MANUFACTURING METHOD THEREOF AND SEMICONDUCTOR DEVICE

(75) Inventors: Yuusuke Sugawara, Yamanashi (JP); Kazuo Nishi, Yamanashi (JP); Tatsuya Arao, Kanagawa (JP); Daiki Yamada, Kanagawa (JP); Hidekazu Takahashi, Kanagawa (JP); Naoto Kusumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/821,201

(22) Filed: Jun. 23, 2010

(65) Prior Publication Data

US 2010/0330729 A1 Dec. 30, 2010

Related U.S. Application Data

(62) Division of application No. 11/383,645, filed on May 16, 2006, now Pat. No. 7,772,667.

(30) Foreign Application Priority Data

May 20, 2005 (JP) ................................. 2005-148583

(51) Int. Cl.
 *H01L 21/00* (2006.01)
(52) U.S. Cl. .............. 438/48; 438/22; 438/59; 257/290; 257/292; 257/E27.133; 257/E29.336
(58) Field of Classification Search .................... 438/48, 438/22, 59; 257/290, 292, E27.133, E29.336
 See application file for complete search history.

(56) References Cited

U.S. PATENT DOCUMENTS

| | | | |
|---|---|---|---|
| 5,032,884 | A | 7/1991 | Yamagishi et al. |
| 5,043,784 | A | 8/1991 | Yamamoto et al. |
| 5,844,255 | A | 12/1998 | Suzuki et al. |
| 6,075,256 | A | 6/2000 | Kaifu et al. |
| 6,188,380 | B1 | 2/2001 | Kawashima et al. |
| 6,287,888 | B1 | 9/2001 | Sakakura et al. |
| 6,291,763 | B1 | 9/2001 | Nakamura |
| 6,512,279 | B2 | 1/2003 | Kaifu et al. |
| 6,531,711 | B2 | 3/2003 | Sakakura et al. |
| 6,955,773 | B2 | 10/2005 | Hsu |
| 6,982,422 | B2 | 1/2006 | Kaifu et al. |
| 7,022,997 | B2 | 4/2006 | Kaifu et al. |
| 7,030,511 | B2 | 4/2006 | Zarei |

(Continued)

FOREIGN PATENT DOCUMENTS

CN 1986106353 A 12/1987

(Continued)

OTHER PUBLICATIONS

Office Action (Chinese Patent Application No. 200610082461.3) mailed Oct. 24, 2008 with English translation, 14 pages.

*Primary Examiner* — Andy Huynh
(74) *Attorney, Agent, or Firm* — Fish & Richardson P.C.

(57) ABSTRACT

A manufacturing method of a photoelectric conversion device includes the following steps: forming a first electrode over a substrate; and, over the first electrode, forming a photoelectric conversion layer that includes a first conductive layer having one conductivity, a second semiconductor layer, and a third semiconductor layer having a conductivity opposite to the one conductivity of the second semiconductor layer over the first electrode. The manufacturing method further includes the step of removing a part of the second semiconductor layer and a part of the third semiconductor layer in a region of the photoelectric conversion layer so that the third semiconductor layer does not overlap the first electrode.

17 Claims, 23 Drawing Sheets

U.S. PATENT DOCUMENTS

| | | |
|---|---|---|
| RE39,780 E | 8/2007 | Kaifu et al. |
| 7,335,951 B2 | 2/2008 | Nishi et al. |
| 7,851,278 B2 | 12/2010 | Nishi et al. |
| RE42,157 E | 2/2011 | Kaifu et al. |
| 2002/0044208 A1 | 4/2002 | Yamazaki et al. |
| 2002/0167061 A1 | 11/2002 | Kaifu et al. |
| 2005/0167573 A1 | 8/2005 | Maruyama et al. |
| 2006/0186497 A1 | 8/2006 | Nishi et al. |
| 2006/0261253 A1 | 11/2006 | Arao et al. |
| 2007/0187790 A1 | 8/2007 | Takahashi et al. |
| 2011/0073981 A1 | 3/2011 | Nishi et al. |

FOREIGN PATENT DOCUMENTS

| | | |
|---|---|---|
| EP | 0221523 A2 | 5/1987 |
| EP | 0494088 A1 | 7/1992 |
| EP | 0494090 A2 | 7/1992 |
| EP | 0660421 A2 | 6/1995 |
| EP | 0861017 A2 | 8/1998 |
| EP | 1453101 A2 | 9/2004 |
| EP | 1465259 A2 | 10/2004 |
| EP | 1523043 A2 | 4/2005 |
| EP | 2287911 A2 | 2/2011 |
| JP | 61196573 A | 8/1986 |
| JP | 63-314863 A | 12/1988 |
| JP | 2001184 A | 1/1990 |
| JP | 08-116044 A | 5/1996 |
| JP | 03171808 B2 | 6/2001 |
| JP | 3193315 A | 7/2001 |
| JP | 2003047017 A | 2/2003 |
| JP | 2003060744 A | 2/2003 |
| JP | 2005-136394 A | 5/2005 |
| WO | WO2005114749 A1 | 12/2005 |

-- PRIOR ART --

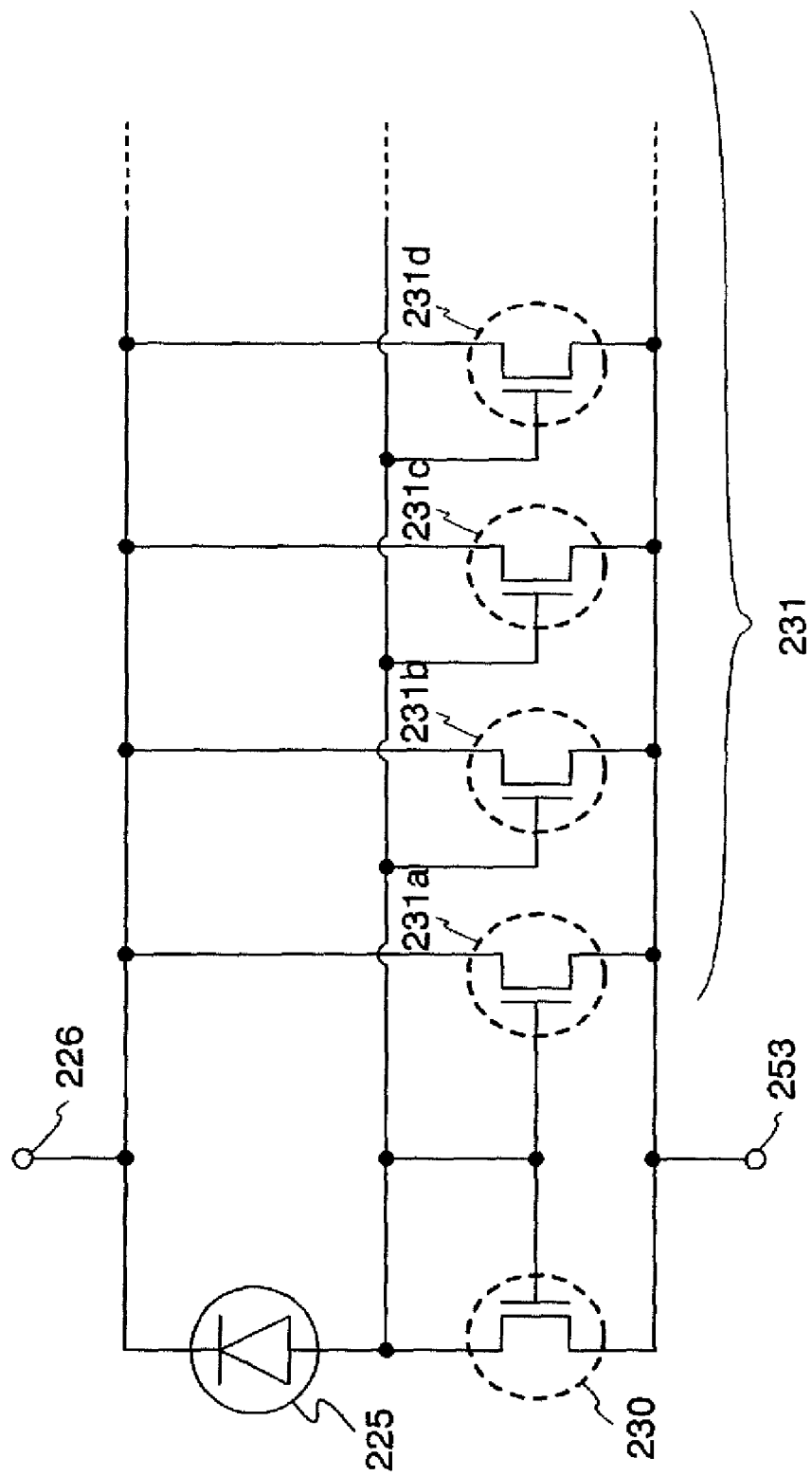

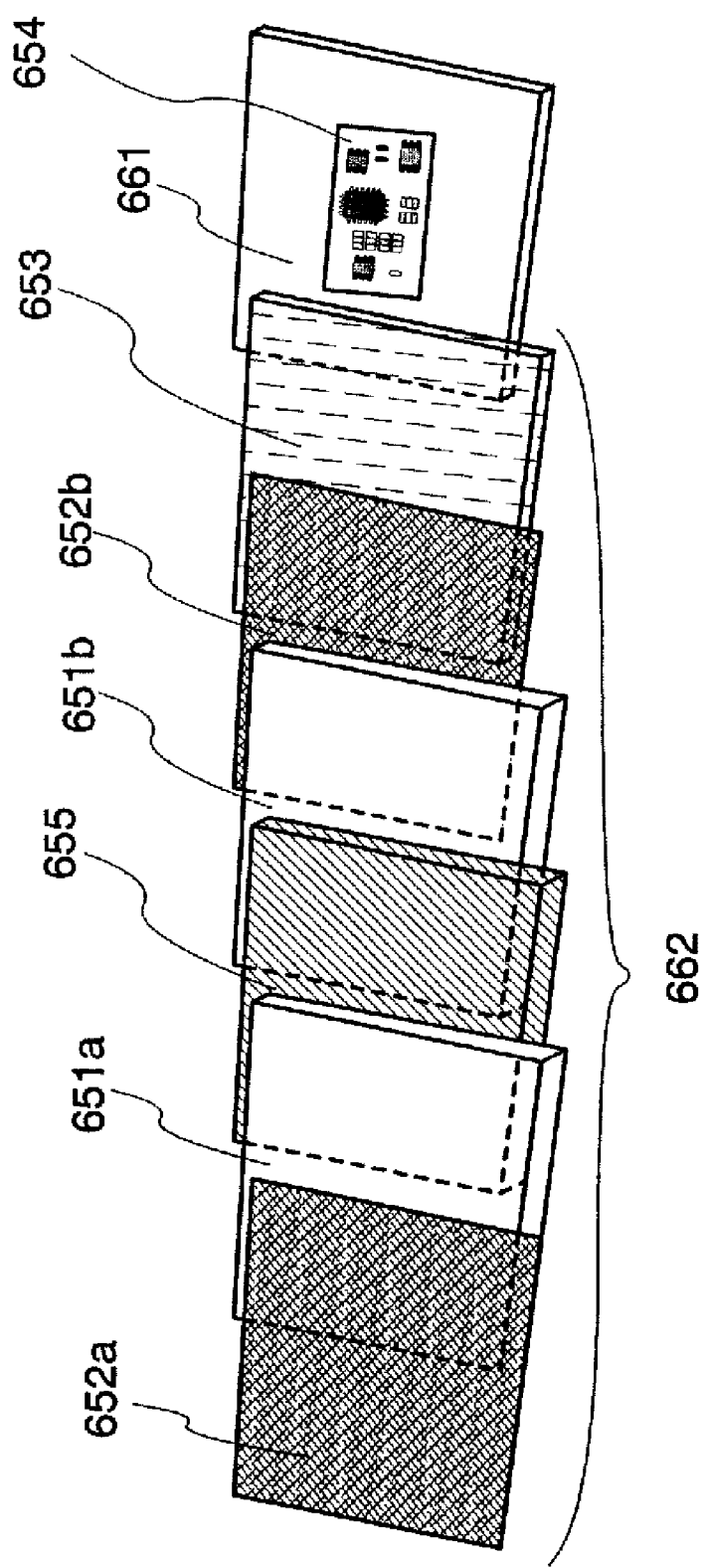

-- PRIOR ART --

-- PRIOR ART --

-- PRIOR ART --

-- PRIOR ART --

PHOTOELECTRIC CONVERSION DEVICE, MANUFACTURING METHOD THEREOF AND SEMICONDUCTOR DEVICE

CROSS-REFERENCE TO RELATED APPLICATIONS

This application is a divisional of U.S. application Ser. No. 11/383,645, filed May 16, 2006, now allowed, which claims the benefit of a foreign priority application filed in Japan as Serial No. 2005-148583 on May 20, 2005 both of which are incorporated by reference.

BACKGROUND OF THE INVENTION

1. Field of the Invention

The present invention relates to a photoelectric conversion device, specifically, a photoelectric conversion device formed using a thin film semiconductor element and a manufacturing method thereof. Further, the present invention relates to electronic devices using a photoelectric conversion device.

2. Description of the Related Art

A number of photoelectric conversion devices generally used for detecting an electromagnetic wave are known, and for example, a photoelectric conversion device having sensitivity in ultra-violet rays to infrared rays are referred to as a photo-sensor in general. A photo-sensor having sensitivity in a visible radiation region with a wave length of 400 nm to 700 nm is particularly referred to as a visible light sensor, and a large number of visible light sensors are used for devices which need illuminance adjustment or on/off control depending on a human living environment.

In particular, in a display device, brightness in the periphery of the display device is detected to adjust display luminance. This is done because unnecessary electric-power can be reduced and visibility can be enhanced by detecting peripheral brightness and obtaining appropriate display luminance. Specifically, such a photo-sensor for adjusting luminance is used for a cellular phone or a personal computer (for example, Reference 1: Japanese Patent Laid Open No. 2003-60744).

In addition, as well as peripheral brightness, luminance of a back light of a display device, particularly, a liquid crystal display device is also detected by a photo-sensor to adjust luminance of a display screen (for example, Reference 2: Japanese Patent No. 3171808 and Reference 3: Japanese Patent No. 3193315).

Further, in a display device using a projector, the convergence adjustment is to conducted by using a photo-sensor. The convergence adjustment is to adjust an image so that an image of each color of RGB does not generate discrepancy. By using a photo-sensor, a location of an image of each color is detected, and the image is arranged in the right location (for example, Reference 4: Japanese Patent Laid Open No. 2003-47017).

FIG. 2 shows a structure of a photoelectric conversion device that has been used conventionally. In FIG. 2, an electrode 1002 is formed over a substrate 1001, and a p-type semiconductor layer 1003, an intrinsic semiconductor layer 1004 (also referred to as an i-type semiconductor film) and an n-type semiconductor layer 1005, which serve as a photoelectric conversion layer, are formed over the electrode 1002. Further, an electrode 1006 is formed over the n-type semiconductor layer 1005. Then, an insulating film 1007 is formed to cover the electrodes 1002 and 1006. Moreover, a first extraction electrode 1012 connected to the electrode 1002 and a second extraction electrode 1013 connected to the electrode 1006 are formed over the insulating film 1007.

However, it is known that in the photoelectric conversion device having the structure shown in FIG. 2, a leakage current occurs in some cases where the photoelectric conversion device operates for a long time. The occurrence of the leakage current is caused, because a crack 1021 is produced in the photoelectric conversion layer, in particular, in a corner portion (step portion) of the i-type semiconductor layer 1004, and the portion becomes a leakage path.

FIGS. 22A to 22C shows photographs of a conventional structure taken by an electronic microscope. As shown in FIGS. 22A to 22C, it can be known that a crack is generated in a corner portion (a step portion) of an i-type semiconductor layer. When an electric field concentrates on this crack, defects such as occurrence of leakage current are caused.

SUMMARY OF THE INVENTION

It is an object of the present invention to prevent an electric field from concentrating on a corner portion of a photoelectric conversion layer, and to manufacture a photoelectric conversion device in which occurrence of leakage current is suppressed.

In an photoelectric conversion device of the present invention, by removing a part of an upper layer and a middle layer of a photoelectric conversion layer, it is possible to prevent an electric field from concentrating on a corner portion and to suppress leakage current.

An aspect of the present invention is a photoelectric conversion device comprising: a first electrode over a substrate; a photoelectric conversion layer including a first semiconductor layer having one conductivity, a second semiconductor layer, and a third conductive layer having a conductivity opposite to the one conductivity over the first electrode, wherein a part of an end portion of the first electrode is covered with the first semiconductor layer.

In the present invention, the first semiconductor layer covers the end portion of the first electrode, an insulating film and a second electrode which is electrically connected to the third semiconductor layer with the insulating film therebetween, over the insulating film are provided over the third semiconductor layer, wherein a part of the second semiconductor layer and the third semiconductor layer is removed in a region of the photoelectric conversion layer, which is not covered with the insulating film.

An aspect of the present invention is a photoelectric conversion device comprising: a first structure including: a first electrode over a substrate; a first semiconductor layer having one conductivity over the first electrode; a second semiconductor layer over the first semiconductor layer; a second structure including: the first semiconductor layer over the substrate; the second semiconductor layer over the first semiconductor layer; a third semiconductor layer having a conductivity opposite to the one conductivity of the first semiconductor layer over the second semiconductor layer; a second electrode over the third semiconductor layer, wherein a contact portion of the first electrode and the first semiconductor layer is apart from a contact portion of the third semiconductor layer and the second electrode.

An aspect of the present invention is a manufacturing method of a photoelectric conversion device, comprising the steps of: forming a first electrode over a substrate; forming a first semiconductor film having one conductivity, a second semiconductor film, and a third conductivity film having a conductivity opposite to the one conductivity over the first electrode, wherein a portion of an end portion of the first electrode is covered with the first semiconductor layer.

An aspect of the present invention is a manufacturing method of a photoelectric conversion device, comprising the steps of: forming a first electrode over a substrate; forming a first semiconductor film having one conductivity, a second semiconductor film, and a third conductivity film having a conductivity opposite to the one conductivity over the first electrode; forming a second electrode over the third semiconductor film, wherein the substrate, the first semiconductor film, the second semiconductor film, the third semiconductor film and the second electrode comprises a first structure including: the first electrode over the substrate; the first semiconductor layer having one conductivity over the first electrode; the second semiconductor layer over the first semiconductor layer; and a second structure including: the first semiconductor layer over the substrate; the second semiconductor layer over the first semiconductor layer; the third semiconductor layer having a conductivity opposite to the one conductivity of the first semiconductor layer, over the second semiconductor layer; the second electrode over the third semiconductor layer, wherein a contact portion of the first electrode and the first semiconductor layer is apart from a contact portion of the third semiconductor layer and the second electrode.

An aspect of the present invention is a manufacturing method of a photoelectric conversion layer, comprising the steps of: forming a first electrode over a substrate; forming a first semiconductor film having one conductivity, a second semiconductor film, and a third conductivity film having a conductivity opposite to the one conductivity over the first electrode; forming a first conductive film over the third semiconductor film; forming a first island-shaped semiconductor film, a second island-shaped semiconductor film, a third island-shaped semiconductor film, and a first island-shaped conductive film from the first semiconductor film, the second semiconductor film, the third semiconductor film, and the first conductive film, respectively, and exposing a part of the first electrode, forming a second conductive film using the first island-shaped conductive film; removing a part of the second island-shaped semiconductor film and the third semiconductor film using the second island-shaped semiconductor film as a mask, wherein the first island-shaped semiconductor film serves as a first semiconductor layer of a photoelectric conversion layer; the second island-shaped semiconductor film of which the part is removed serves as a second semiconductor layer of the photoelectric conversion layer; and the third island-shaped semiconductor film of which the part is removed serves as a third semiconductor layer of the photoelectric conversion layer; forming an insulating film to cover the first electrode which is exposed, the first semiconductor layer of the photoelectric conversion layer, the second semiconductor layer of the photoelectric conversion layer, the third semiconductor layer of the photoelectric conversion layer, wherein a first groove and a second groove which reach the first electrode which is exposed and the second conductive film in the insulating film, and forming a second electrode and a third electrode over the insulating film, which are electrically connected to the first electrode and the second electrode respectively through the first groove and the second groove.

An aspect of the present invention is a semiconductor device comprising a photoelectric conversion element, and an amplifier circuit which amplifies an output value of the photoelectric conversion element over a substrate; the photoelectric conversion element comprising: a first electrode; a photoelectric conversion layer including a first semiconductor layer having one conductivity, a second semiconductor layer, and a third conductive layer having a conductivity opposite to the one conductivity, over the first electrode, wherein the first semiconductor layer covers an end portion of the first electrode; an insulating film over the third semiconductor layer; a second electrode electrically connected to the third semiconductor layer with the insulating film therebetween, over the insulating film; wherein a part of the second semiconductor layer and the third semiconductor layer are removed in a region of the photoelectric conversion layer, which is not covered with the insulating film, the amplifier circuit comprising: a plurality of thin film transistors, the plurality of thin film transistors each including: an island-shaped semiconductor region including a source region, a drain region and a channel formation region; a gate insulating film; a gate electrode; a source electrode electrically connected to the source region; and a drain electrode electrically connected to the drain region.

In the present invention, the substrate is a flexible substrate.

In the present invention, the substrate is one of a polyethylenenaphthalate (PEN) film, a polyethyleneterephthalate (PET) film, a polybutylenenaphthalate (PBN) film, a polyimide (PI) film, and a polyamide (PA) film.

In the present invention, the substrate is a glass substrate.

In the present invention, a color filter is provided between the substrate and the first semiconductor layer.

In the present invention, each of the source electrode and the drain electrode has a structure of stacked films.

In the present invention, the structure of the stacked films is a structure in which a titanium (Ti) film, an aluminum (Al) film including a slight amount of silicon (Si), and a titanium (Ti) film are stacked.

In the present invention, each of the source electrode and the drain electrode has a single layer film.

In the present invention, the single layer film is made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), or an alloy material or a compound material containing the element as its main component; or a single layer film made of a nitride thereof, such as titanium nitride, tungsten nitride, tantalum nitride or molybdenum nitride.

A photoelectric conversion device of the present invention can suppress a leakage current. In accordance with the present invention, a highly reliable photoelectric conversion device which consumes less power can be obtained. Further, electronic devices incorporating such a photoelectric conversion device can have a high reliability.

BRIEF DESCRIPTION OF DRAWINGS

In the accompanying drawings:

FIG. 11 is an equivalent circuit diagram of a device incorporating a photoelectric conversion device of the present invention;

FIG. 20 shows an example of an electronic device incorporating a photoelectric conversion device of the present invention;

DETAILED DESCRIPTION OF THE INVENTION

Embodiment

A photoelectric conversion device of the present invention will be described with reference to FIG. 1, FIGS. 4A to 4C, FIGS. 5A and 5B, and FIGS. 6A and 6B. The present invention is not limited to the following description, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Figure 4A:
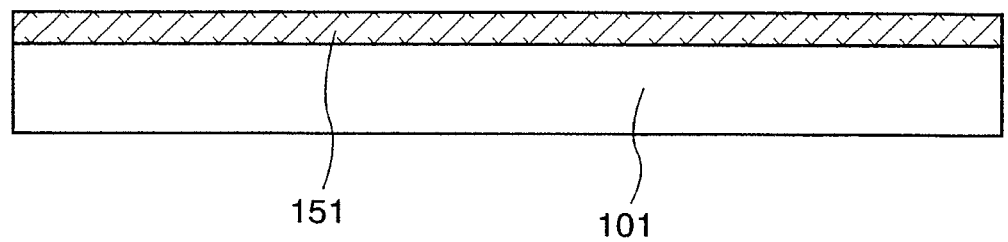
FIGS. 4A to 4C show manufacturing steps of a photoelectric conversion device of the present invention.

Manufacturing steps of a photoelectric conversion device of the present invention are shown below. A first conductive film 151 is formed over a substrate 101 first (FIG. 4A).

A flexible substrate is used as the substrate 101, and specifically, a film of polyethylenenaphthalate (PEN) is used. In addition to polyethylenenaphthalate, a film of polyethyleneterephthalate (PET), polybutylenenaphthalate (PBN), polyimide (PI), polyamide (PA) or the like may be used. Further, a glass substrate may also be used as the substrate 101.

As the first conductive film 151, a single layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) or copper (Cu), or an alloy material or a compound material containing the element as its main component; or a single layer film made of a nitride thereof, such as titanium nitride, tungsten nitride, tantalum nitride or molybdenum nitride can be used.

A transparent conductive material may also be used for the first conductive film 151. As such transparent conductive materials, an indium oxide-tin oxide alloy containing silicon (Si) (also referred to as indium tin oxide containing Si) may be used. Besides the indium oxide-tin oxide alloy containing Si, zinc oxide (ZnO), tin oxide ($SnO_2$), indium oxide, or an indium oxide-zinc oxide alloy formed by using a target in which indium oxide is mixed with 2 to 20 wt % of zinc oxide (ZnO) may also be used. Further, ZnO doped with $Ga_2O_3$ (GZO), ZnO doped with $Al_2O_3$ (AZO), or ZnO doped with $SiO_2$ (SZO) may be used. GZO, AZO, and SZO are useful since they do not oxidize silicon.

Figure 4B:
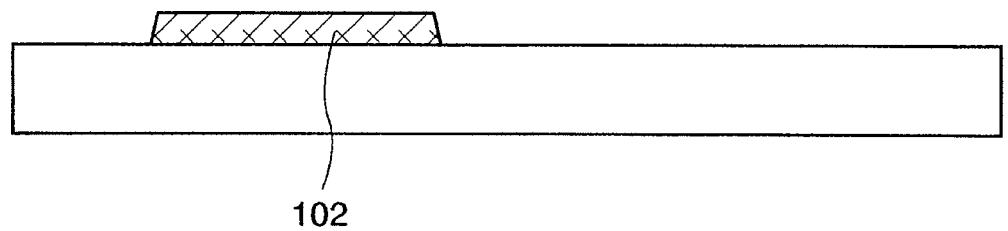

Next, an electrode 102 is formed using the first conductive film 151 (FIG. 4B).

After the electrode 102 is formed, a p-type semiconductor film 152 is formed. In this embodiment, a p-type amorphous semiconductor film is, for example, formed as the p-type semiconductor film 152. As the p-type amorphous semiconductor film, an amorphous silicon film including an impurity element belonging to Group 13, such as boron (B) is formed by a plasma CVD method.

After the p-type semiconductor film 152 is formed, a semiconductor film which does not include an impurity element imparting a conductivity (also referred to as an intrinsic semiconductor film or an i-type semiconductor film) 153 and an n-type semiconductor film 154 are sequentially formed. In this embodiment, the p-type semiconductor film 152 of 10 to 50 nm in thickness, the i-type semiconductor film 153 of 200 to 1000 nm in thickness, and the n-type semiconductor film 154 of 20 to 200 nm in thickness are formed.

As the i-type semiconductor film 153, an amorphous silicon film may be formed by a CVD method, for example. As the n-type semiconductor film 154, an amorphous silicon film including an impurity element belonging to Group 15, such as phosphorus (P) may be formed, or after the amorphous silicon film is formed, an impurity element belonging to Group 15 may be introduced.

It should be noted that the p-type semiconductor film 152, the i-type semiconductor film 153 and the n-type semiconductor film 154 may be formed in reverse order, in other words, the n-type semiconductor film, the i-type semiconductor film and the p-type semiconductor film may be formed sequentially.

As the p-type semiconductor film 152, the i-type semiconductor film 153 and the n-type semiconductor film 154, a semiamorphous semiconductor film may be used instead of the amorphous semiconductor film.

A semiamorphous semiconductor film includes a semiconductor that has an intermediate structure between an amorphous semiconductor and a semiconductor having a crystal structure (including a single crystal and a polycrystal). The semiamorphous semiconductor has a third condition that is stable in terms of free energy, and it is a crystalline substance including a short range order and lattice distortion, and has a crystal grain size of 0.5 to 20 nm which can be dispersed in a non-single crystal semiconductor film. As for a semiamorphous semiconductor film, Raman spectrum is shifted to a wave number lower than 520 cm$^{-1}$, and diffraction peaks of (111) and (220) that are said to be caused by a crystal lattice of Si are observed in X-ray diffraction. In addition, at least 1 atomic % or more of hydrogen or halogen is contained to terminate dangling bonds. In the present specification, the semiconductor film as described above is referred to as a semiamorphous semiconductor (SAS) film for convenience. Moreover, a rare gas element such as helium, argon, krypton, or neon may be contained to further promote lattice distortion so that stability is enhanced and a favorable semiamorphous semiconductor film is obtained. It is to be noted that a semiamorphous semiconductor film also includes a micro-crystalline semiconductor film (a microcrystal semiconductor film).

The SAS film can be obtained by glow discharge decomposition of a gas containing silicon. SiH$_4$ is typically used as the gas containing silicon, and further, Si$_2$H$_6$, SiH$_2$Cl$_2$, SiHCl$_3$, SiCl$_4$, SiF$_4$, or the like can also be used. The gas containing silicon may be diluted with hydrogen, or a gas in which one or more of rare gas elements such as helium, argon, krypton and neon are added to hydrogen, so as to easily form the SAS film. It is preferable that the gas containing silicon be diluted at a dilution ratio ranging from 2 to 1000. Furthermore, a carbide gas such as CH$_4$ or C$_2$H$_6$, a germanic gas such as GeH$_4$ or GeF$_4$, F$_2$, or the like may be mixed in the gas containing silicon to adjust an energy band width to be 1.5 to 2.4 eV or 0.9 to 1.1 eV.

Figure 4C:
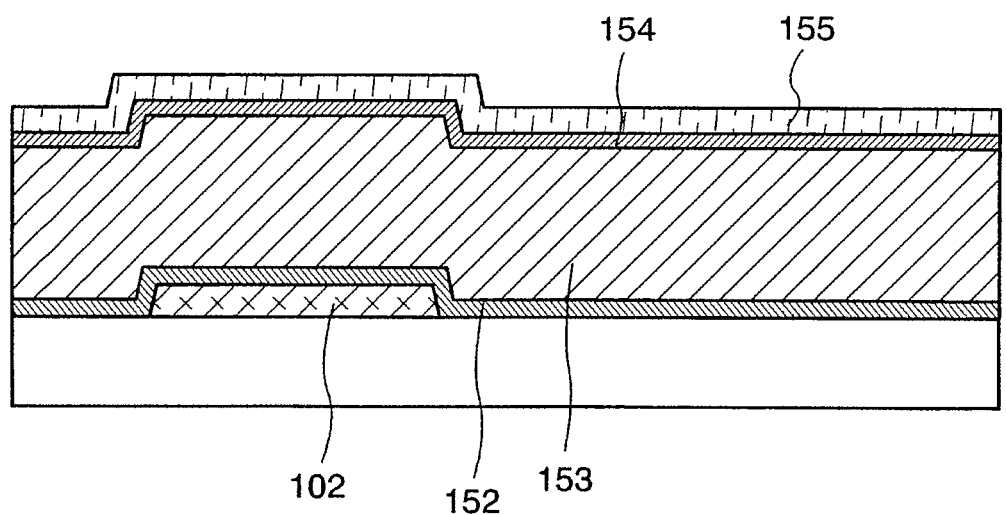

Next, a second conductive film 155 is formed over the n-type semiconductor film 154 by a sputtering method or the like (FIG. 4C). The second conductive film 155 may be formed using the same material as the first conductive film 151.

Figure 5A:
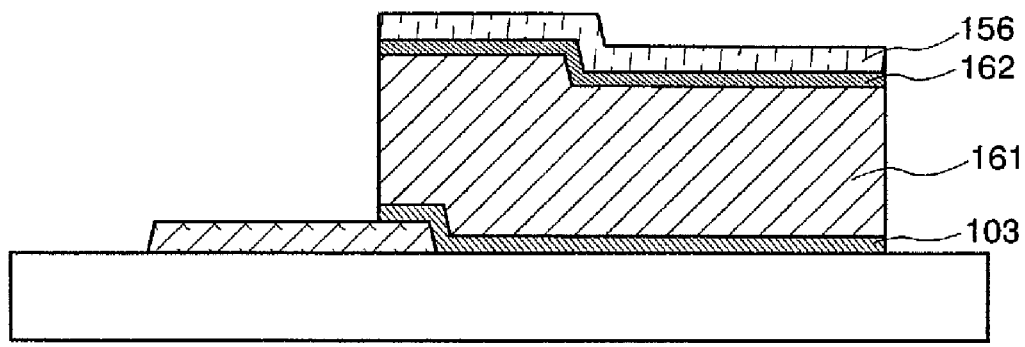
FIGS. 5A and 5B show manufacturing steps of a photoelectric conversion device of the present invention.

Then, the p-type semiconductor film 152, the i-type semiconductor film 153, the n-type semiconductor film 154 and the second conductive film 155 are each formed using a mask, into an island-shaped semiconductor film, i.e., a p-type semiconductor layer 103, an i-type semiconductor layer 161, an n-type semiconductor layer 162, and a third conductive film 156 which is an island-shaped conductive film (FIG. 5A).

Figure 5B:
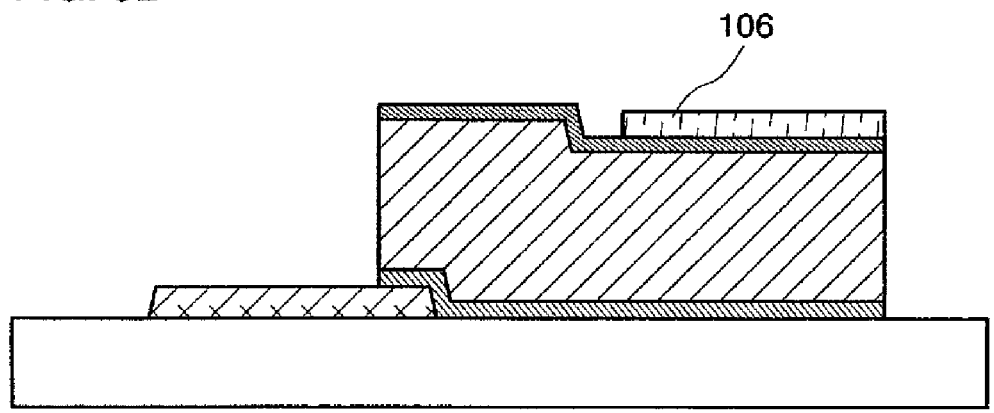

Then, an electrode 106 is formed further using the third conductive film 156 (FIG. 5B).

Figure 6A:
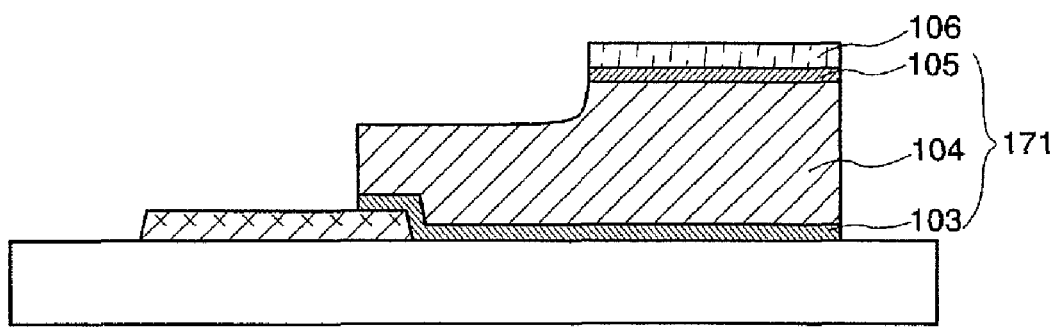
FIGS. 6A and 6B show manufacturing steps of a photoelectric conversion device of the present invention.

A part of the n-type semiconductor layer 162 and the i-type semiconductor layer 161 is etched using the electrode 106 as a mask to form an i-type semiconductor layer 104 and an n-type semiconductor layer 105 (FIG. 6A). At this time, the time for etching is adjusted so as not to etch the p-type semiconductor layer 103. When forming the semiconductor films, the i-type semiconductor film 153 is formed to be thick, and thus, etching is stopped in the middle of the i-type semiconductor layer 161. In other words, since the i-type semiconductor layer 161 serves as a mask for the p-type semiconductor layer 103 in the etching, it is possible that the n-type semiconductor layer 162 is etched without etching the p-type semiconductor layer 103. By this etching step, a part of the n-type semiconductor layer 162 and the i-type semiconductor layer 161, which is not covered with the electrode 106, is removed. As described above, a photoelectric conversion layer 171 including the p-type semiconductor layer 103, the i-type semiconductor layer 104 and the n-type semiconductor layer 105 is formed.

Next, an insulating film 107 having grooves 165 and 166 is formed over the electrode 106, the photoelectric conversion layer 171 and the electrode 102 by a screen printing method or the like. Alternatively, after an insulating film is formed entirely, the grooves 165 and 166 may be formed by a laser scribing method or the like (FIG. 6B.

Figure 1:
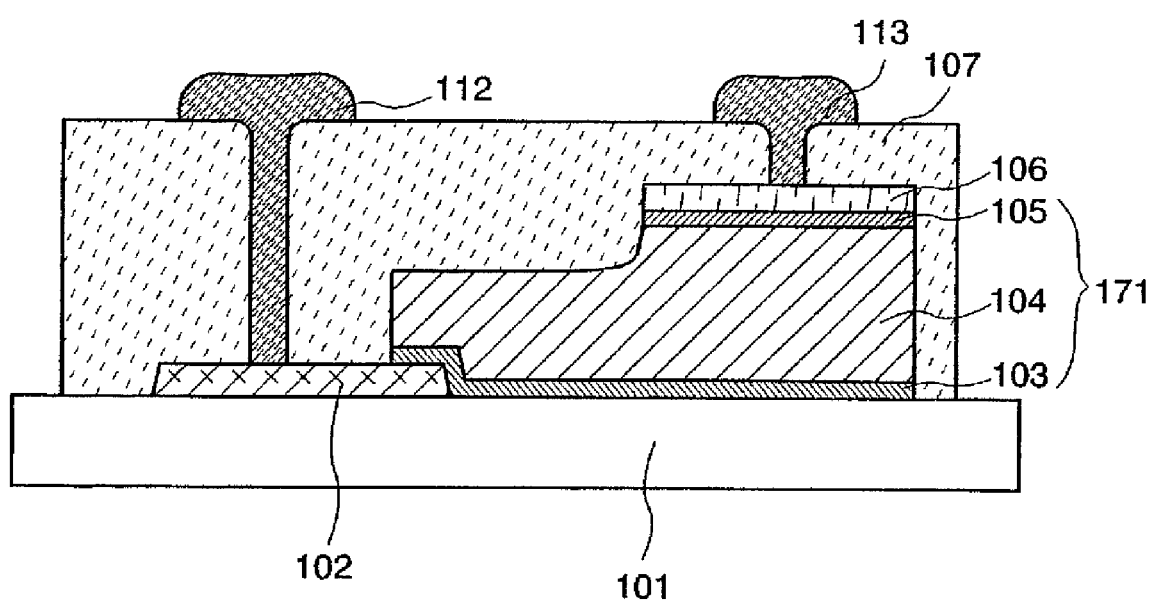
FIG. 1 is a cross sectional view of a photoelectric conversion device of the present invention.

Extraction electrodes 112 and 113 are formed in the grooves 165 and 166 (FIG. 1). The extraction electrodes 112 and 113 are formed using a conductive paste by a screen printing method. As the conductive paste, a conductive paste containing a metal material such as silver (Ag), gold (Au), copper (Cu) or nickel (Ni), or a conductive carbon paste can be used. In addition, the extraction electrodes 112 and 113 may be formed by an inkjet method.

The photoelectric conversion device shown in FIG. 1 is considered to have a first portion in which the electrode 102, the p-type semiconductor layer 103, and the i-type semiconductor layer 104 are formed over the substrate 101, and a second portion in which the p-type semiconductor layer 103, the i-type semiconductor layer 104, the n-type semiconductor layer 105 and the electrode 106 are formed over the substrate 101. As mentioned above, the stack order of the p-type semiconductor film and the n-type semiconductor film may be reverse. Since a contact portion of the electrode 102 and the p-type semiconductor layer 103 is apart from a contact portion of the n-type semiconductor layer 105 and the electrode 106, it is possible to prevent an influence of a crack which may occur in the photoelectric conversion layer 171, specifically, in a step portion (a corner portion) of the i-type semiconductor layer 104. Thus, leakage current can be suppressed, and a highly reliable photoelectric conversion device can be obtained.

Example 1

Figure 23A:
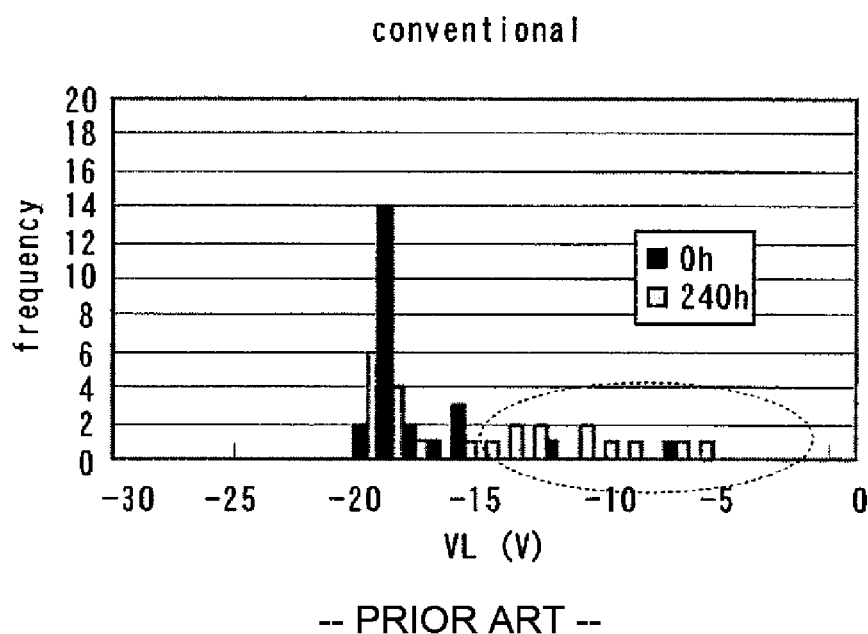
FIGS. 23A and 23B show a comparison between a photoelectric conversion device of the present invention, and a conventional photoelectric conversion device.
Figure 23B:
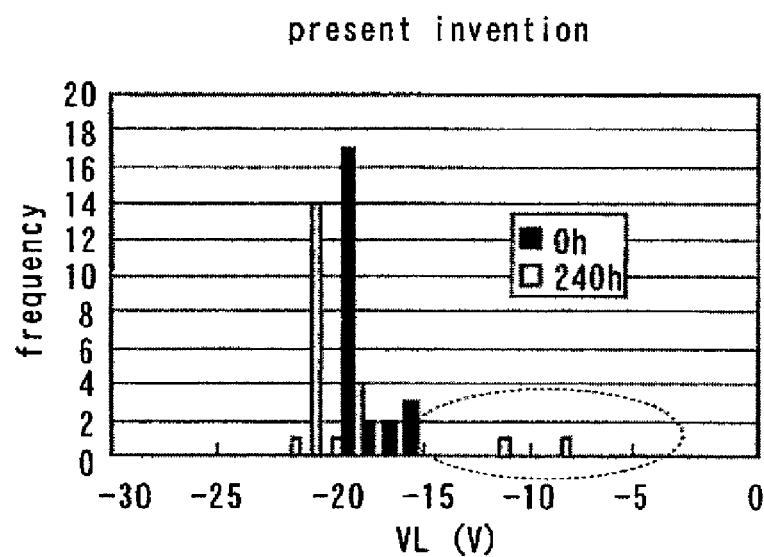

In Example 1, a photoelectric conversion device of the present invention is compared with a conventional photoelectric conversion device with reference to FIGS. 23A and 23B.

In this example, a THB test (Temperature Humidity Bias test) is conducted to evaluate the devices under conditions such as a high temperature of 60° C., a humidity of 90 to 95% and a bias of −5V.

Figure 2:
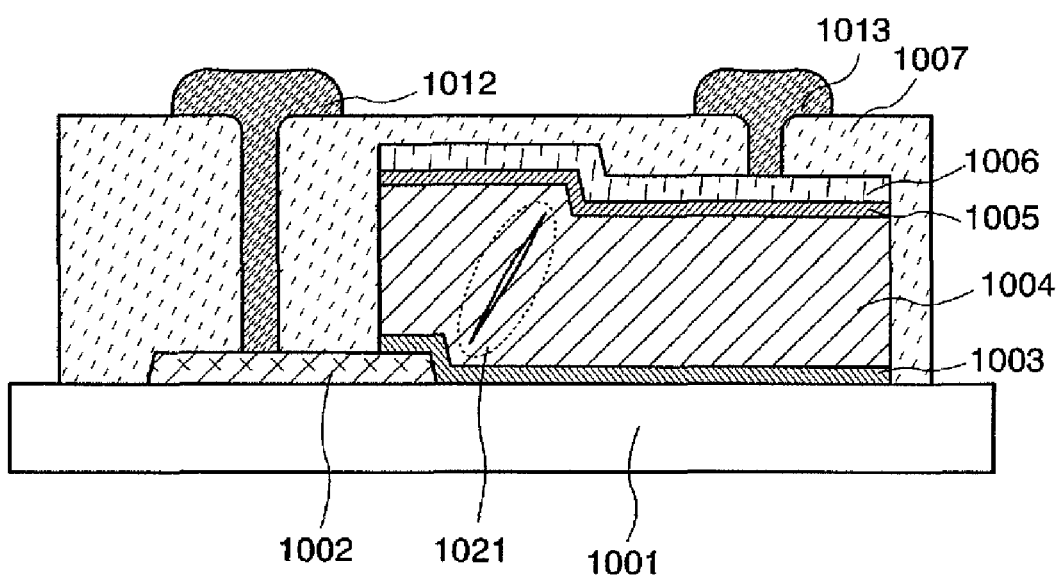
FIG. 2 is a cross sectional view of a conventional photoelectric conversion device.

FIG. 23A shows results of the THB test for the conventional photoelectric conversion device shown in FIG. 2, and FIG. 23B shows results of the THB test for the photoelectric conversion device of the present invention shown in FIG. 1. In addition, in FIGS. 23A and 23B, the horizontal axis represents $V_L$ (V) and the vertical axis represents a frequency in each voltage. In addition, $V_L$ represents a voltage at which leakage current is generated.

In the result of 240 hours of the test time, shifts of Vr leakage are seen in both results for the conventional photoelectric conversion device shown in FIG. 2 and the photoelectric conversion device of the present invention shown in FIG. 1. However, there are seen a difference in frequency of Vr leakage occurrence between the conventional photoelectric conversion device shown in FIG. 2 and the photoelectric conversion device of the present invention shown in FIG. 1. When a shift to −15 V or higher is considered to be a defect (a region surrounded by a dotted line in FIGS. 23A and 23B), in the test for 240 hours, there are seen 11 out of 24 defects in the conventional photoelectric conversion device, while 2 out of 24 defects in the photoelectric conversion device of the present invention.

In accordance with this example, a result is obtained, that the photoelectric conversion device of the present invention has fewer frequencies of leakage current occurrence than the conventional photoelectric conversion device. In other words, in accordance with the present invention, a highly reliable photoelectric conversion device can be obtained.

Example 2

Example 2 describes an example in which an electrode overlapping a photoelectric conversion layer has a structure of stacked films with reference to FIGS. 3A, 3B, 16A and 16B. It should be noted that the same parts as those described in Embodiment are shown by the same reference numerals.

Figure 3A:
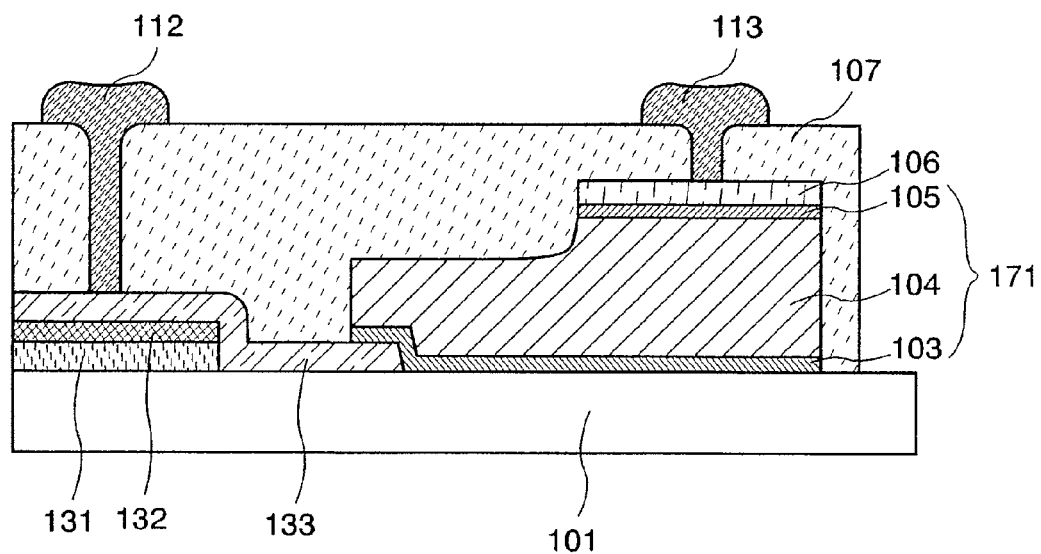
FIGS. 3A and 3B are cross sectional views of a photoelectric conversion device of the present invention.

In this example, an example in which the electrode 102 of FIG. 1 has a three-layer stacked structure is shown in FIGS. 3A, 3B, 16A and 16B. In FIG. 3A, the wiring 131 is made from titanium (Ti), the wiring 132 is made from aluminum (Al), and the wiring 133 is made from titanium (Ti). When the wiring 131 is formed with a transparent electrode, for example, an indium oxide-tin oxide alloy (also referred to as indium tin oxide), or an indium oxide-tin oxide alloy containing silicon (Si) (also referred to as indium tin oxide containing Si) may be used. Besides, zinc oxide (ZnO), tin oxide ($SnO_2$), indium oxide, or an indium oxide-zinc oxide alloy formed by using a target in which indium oxide is mixed with 2 to 20 wt % of zinc oxide (ZnO) may also be used as the transparent electrode. Further, ZnO doped with $Ga_2O_3$ (GZO), ZnO doped with $Al_2O_3$ (AZO), or ZnO doped with $SiO_2$ (SZO) may be used. GZO, AZO, and SZO are useful since they do not oxidize silicon.

In order to obtain a wiring structure of FIG. 3A, a titanium film and an aluminum film are formed as a lower conductive film and a middle conductive film, respectively. A mask is formed over the middle conductive film and the lower conductive film and the middle conductive film are etched using this mask to obtain wirings 131 and 132. Then, a titanium film is formed thereover as an upper conductive film and etched to form the wiring 133. After forming the wiring 133, a photoelectric conversion layer 171 is formed to overlap the wiring 133.

In the structure of FIG. 3A, since a side face of the wiring 132 made of aluminum is covered with the wiring 133, diffusion of an aluminum atom into the photoelectric conversion layer 171 can be prevented.

Figure 3B:
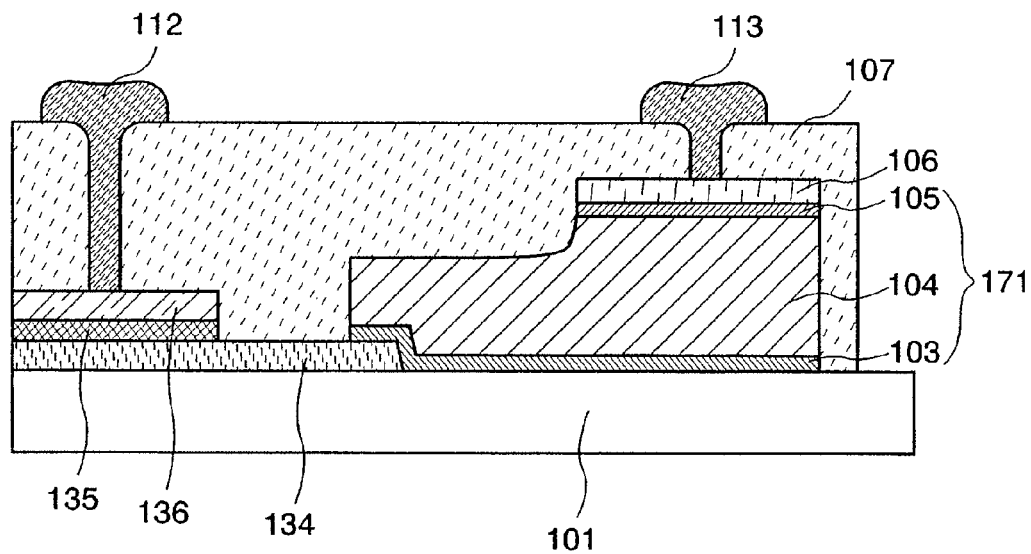

In the structure of FIG. 3B, a titanium film is formed as a lower conductive film and etched to form a wiring 134. After that, a middle conductive film made of aluminum, and an upper conductive film made of titanium are formed over the wiring 134, and etched to obtain wirings 135 and 136 using the same mask. Further, a photoelectric conversion layer 171 is formed to overlap the wiring 134. In addition, either the wirings 135 and 136 or the photoelectric conversion layer 171 may be formed first, as long as the wiring 134 has been formed in advance. When the wirings 135 and 136 are formed after forming the photoelectric conversion layer 171, a mask may be formed to cover the photoelectric conversion layer 171 such that the photoelectric conversion layer 171 is protected, and the wirings 135 and 136 may be formed.

In the structure of FIG. 3B, an insulating film 107 is formed between the wiring 135 and the photoelectric conversion layer 171, and thus, an aluminum atom is not diffused into the semiconductor layer of the photoelectric conversion layer 171.

Figure 16A:
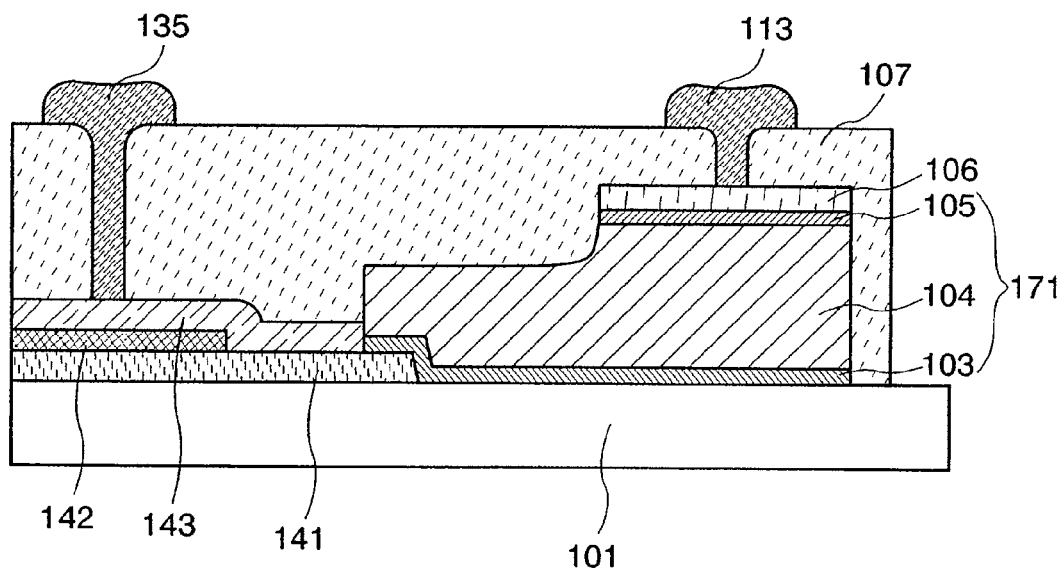
FIGS. 16A and 16B are cross sectional views of a photoelectric conversion device of the present invention.

In FIG. 16A, a wiring 141 is formed using a titanium film as a lower conductive film, and an aluminum film is formed as a middle conductive film, and etched to form the wiring 142. Then, after forming the photoelectric conversion layer 171, a titanium film is formed to cover the wiring 142, as the upper conductive film, and the wiring 143 is formed using the titanium film.

In FIG. 16A, the wiring 143 may or may not be in contact with the i-type semiconductor layer 104, as long as the wiring 143 is not in contact with the n-type semiconductor layer 105. In addition, since the wiring 143 covers a side face of the wiring 142, it is possible to prevent an aluminum atom from diffusing into the photoelectric conversion layer 171.

Figure 16B:
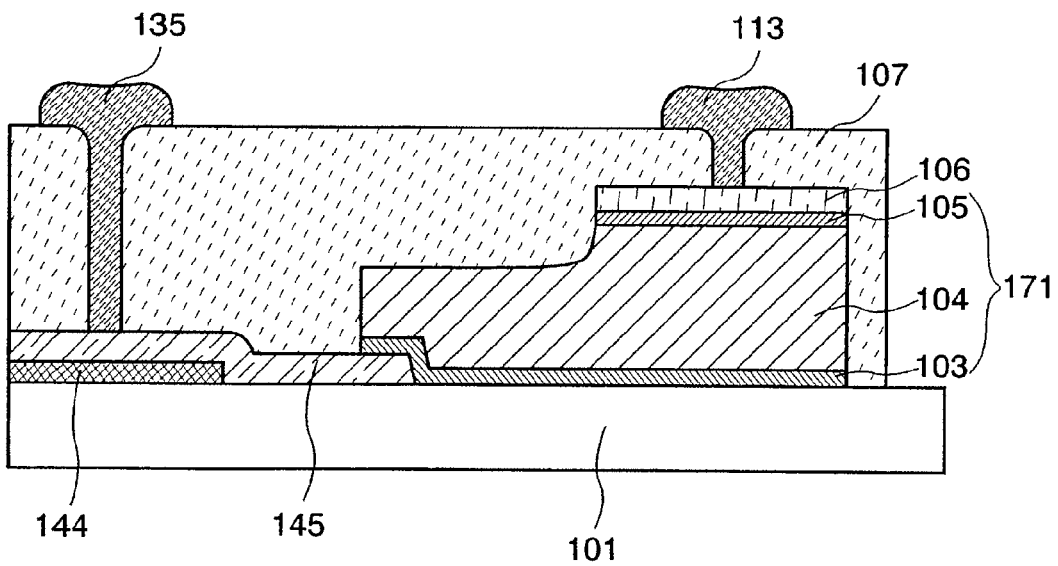

In FIG. 16B, an example is shown, in which the lower conductive film in FIGS. 3A and 16A is removed, and a wiring is formed with the middle conductive film and the upper conductive film.

In FIG. 16B, a wiring 144 is formed of an aluminum film and the wiring 145 is formed of a titanium film to cover a side face of the wiring 144. Thus, an aluminum atom can be prevented from diffusing into the photoelectric conversion layer 171.

Specifically, in comparison of FIG. 16B with FIG. 3A, the wiring 133 of the top layer is formed to overlap an end portion of the wirings 131 and 132, and thus, a step becomes large in FIG. 3A. However, in FIG. 16B, the wiring 145 of the top layer overlaps only an end portion of the wiring 144, and thus, the step becomes smaller. At this time, an effect of more suppressing a disconnection can be obtained.

The structure of the stacked films is not limited to a three-layer structure or a two-layer structure, and may have a structure in which four or more layers are stacked. In addition, when the structure of the stacked films is in contact with the top layer of the photoelectric conversion layer (the n-type semiconductor layer in this example), the n-type semiconductor layer is short-circuited with the p-type semiconductor layer, and it does not function as the photoelectric conversion layer. Thus, the structure of the stacked films is formed so as not to be in contact with the top layer of the photoelectric conversion layer. In addition, in a case of forming a wiring including aluminum, the wiring is formed so as not to diffuse an aluminum atom into the photoelectric conversion layer 171.

The wirings 131 to 136 and 141 to 145 may be an elongation of a source or drain wiring of a TFT. For example, as in Example described below, when a circuit for amplifying an output from a photoelectric conversion element including a photoelectric conversion layer, is formed using a TFT, the source or drain wiring of the TFT can be used as the wirings 131 to 136 and 141 to 145.

This example can be applied to any description of Embodiment and Example 1.

Example 3

In Example 3, a photoelectric conversion device having a different structure from that shown in FIG. 1 is described with reference to FIGS. 7A and 7B.

Figure 7A:
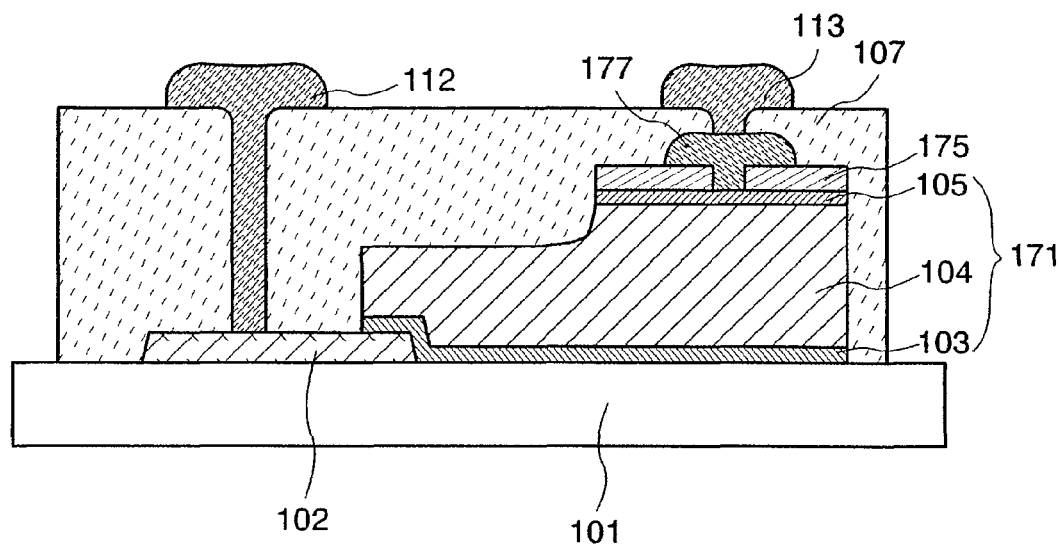
FIGS. 7A and 7B are cross sectional views of a photoelectric conversion device of the present invention.

In the photoelectric conversion device shown in FIG. 7A, an insulating film 175 is formed instead of the electrode 106 shown in FIG. 1. In a step of etching a part of the n-type semiconductor layer 162 and the i-type semiconductor layer 161, shown in FIG. 6A of Embodiment, the insulating film 175 serves as a mask, similarly to the electrode 106. In this way, a part of the n-type semiconductor layer 162 and the i-type semiconductor layer 161, which is not covered with the insulating film 175, is removed to form a photoelectric conversion layer 171 including a p-type semiconductor layer 103, an i-type semiconductor layer 104 and an n-type semiconductor layer 105.

Next, a groove is formed in the insulating film 175, and an electrode 177 is formed to be in contact with the n-type semiconductor layer 105 by a screen printing method. Then, an insulating film 107 is formed to cover the whole. The insulating film 107 having a groove is formed over the insulating film 175, the photoelectric conversion layer 171 and the electrode 102 by a screen printing method or the like, and extraction electrodes 112 and 113 are formed by a screen printing method using a conductive paste. Alternatively, an insulating film is formed entirely, and a groove is formed by a laser scribing method or the like. After that, the extraction electrodes 112 and 113 may be formed.

Figure 7B:
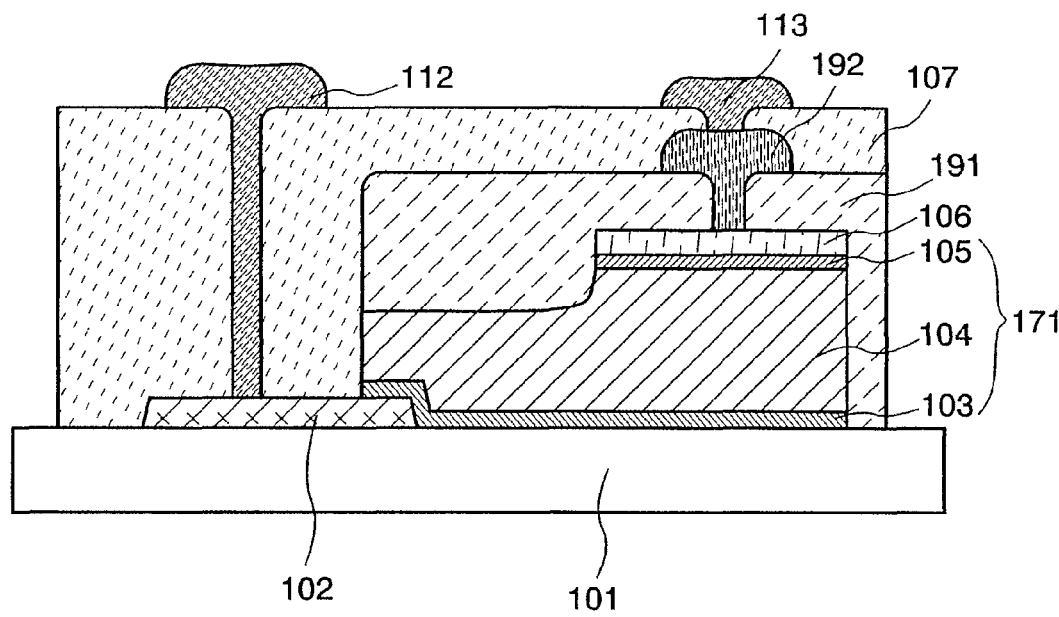

The photoelectric conversion device shown in FIG. 7B is formed based on the description of Embodiment until the step shown in FIG. 6A is conducted. Then, the insulating film 191 having a groove is formed by a screen printing method or the like, and an electrode 192 is formed by a screen printing method or the like using a conductive paste. Alternatively, the insulating film 191 may be formed entirely, a groove is formed by a laser scribing method or the like, and then, the electrode 192 may be formed.

Next, as in the description of Embodiment, the insulating film 107 is formed and the extraction electrodes 112 and 113 are formed.

This example can be applied to any description of Embodiment and Examples 1 and 2.

Example 4

In Example 4, an example of forming a color filter in a photoelectric conversion device of the present invention will be described with reference to FIGS. 8A and 8B.

Figure 8A:
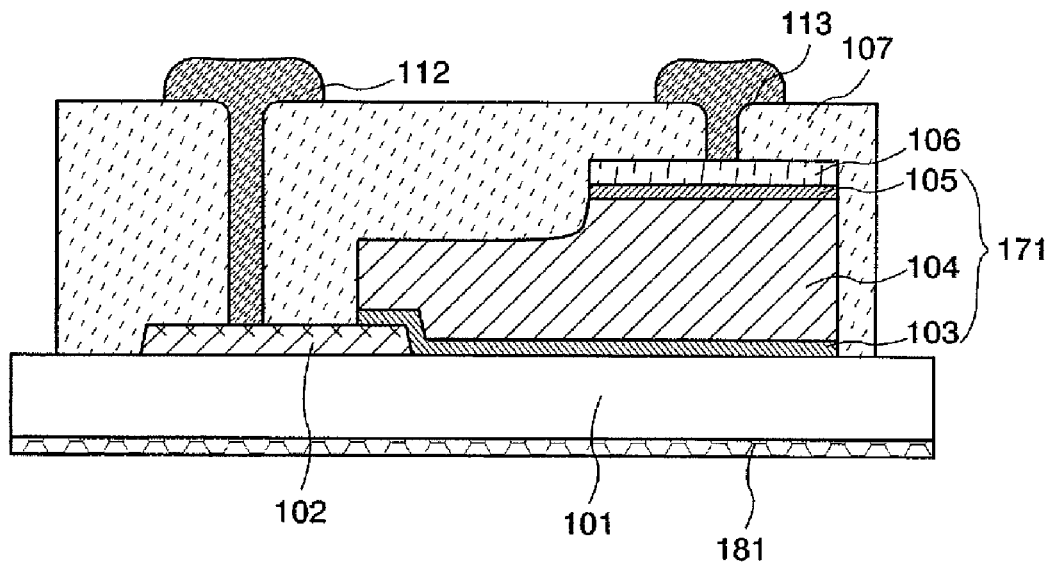
FIGS. 8A and 8B are cross sectional views of a photoelectric conversion device of the present invention.
Figure 8B:
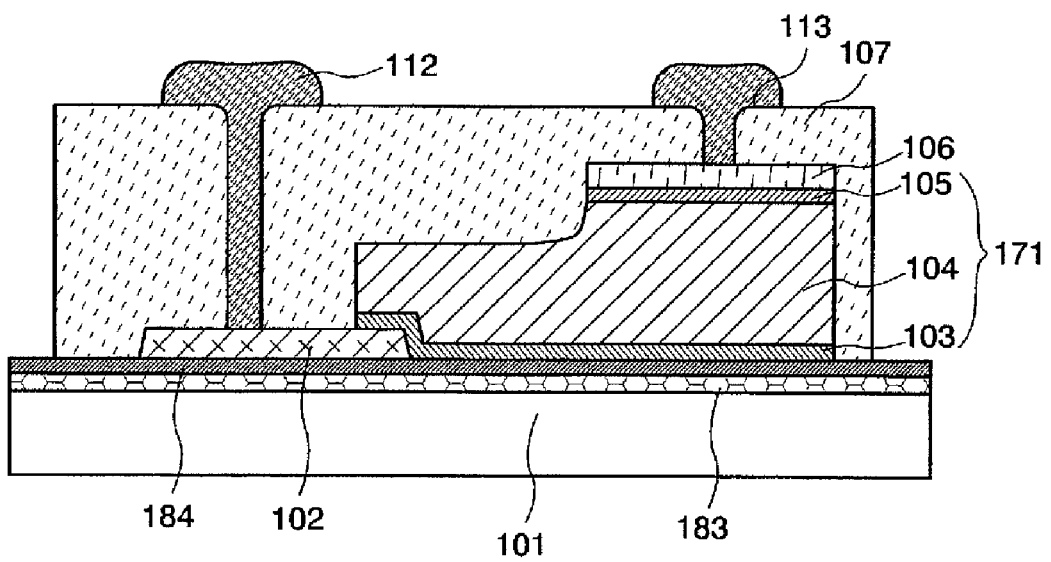

FIGS. 8A and 8B show an example in which a color filter is formed in the photoelectric conversion device of FIG. 1. In the photoelectric conversion device of FIG. 8A, a color filter 181 is formed in a surface of a substrate 101, in which a photoelectric conversion layer 171 is not formed.

By providing the color filter 181, light of red (R), green (G) and blue (B) can each be absorbed selectively.

In addition, FIG. 8B shows an example in which a color filter is formed between the substrate 101 and the photoelectric conversion layer 171.

In FIG. 8B, a color filter 183 is formed over the substrate 101, and further, a passivation film 184 is formed between the color filter 183 and the photoelectric conversion layer 171, and the color filter 183 and the electrode 102.

In the structure shown in FIG. 8B, even when light enters obliquely through the substrate 101, the light can pass through the color filter; and thus, the incident light can be used effectively.

This example can be applied to any description of Embodiment and Examples 1 to 3.

Example 5

In Example 5, a semiconductor device using the photoelectric conversion device of the present invention will be described with reference to FIGS. 9A and 9B, 10A and 10B, 11, 12A to 12D, 13A to 13D, and 14A to 14C as examples.

Figure 9A:
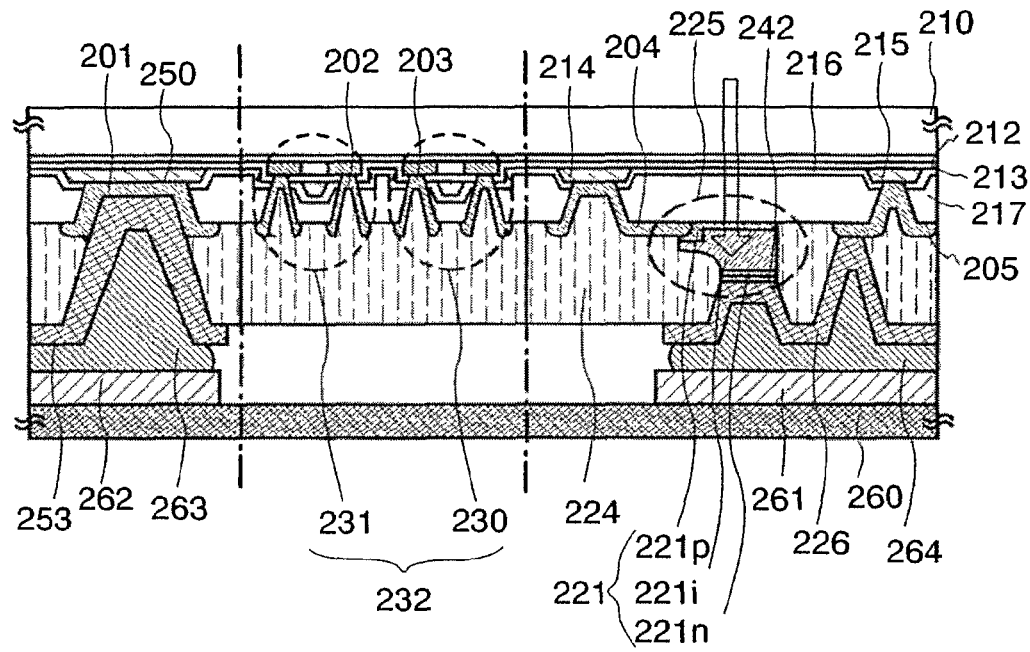
FIGS. 9A and 9B are cross sectional views of a device on which a photoelectric conversion device of the present invention is mounted.
Figure 9B:
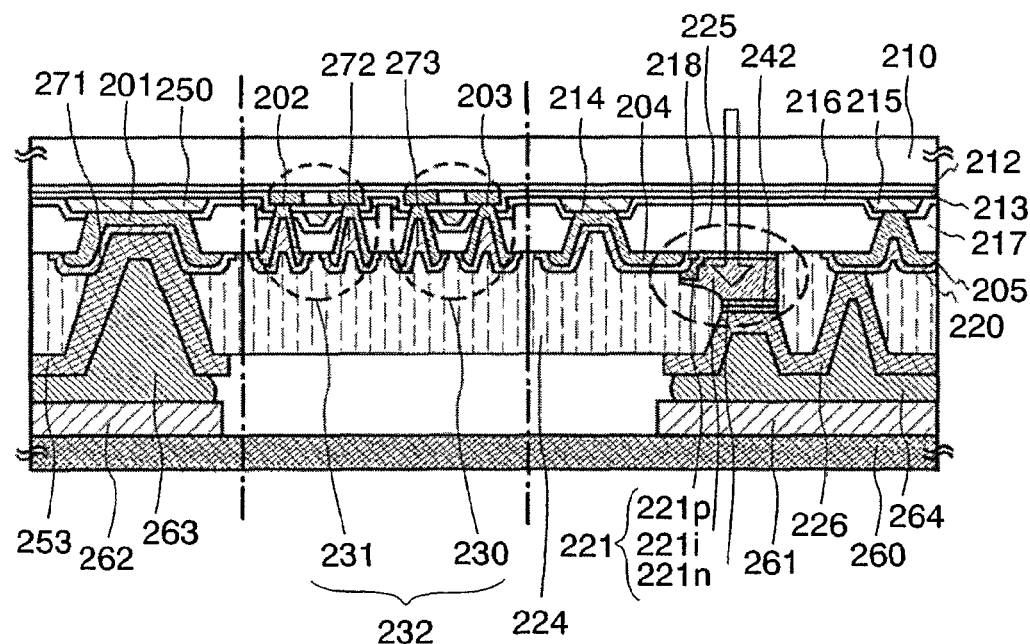

In FIGS. 9A and 9B, as an example of a semiconductor device using the photoelectric conversion device of the present invention, a visible light sensor chip with two terminals is shown. The visible light sensor chip shown in FIGS. 9A and 9B includes a substrate 210, a base insulating film 212, and a gate insulating film 213. Since received light passes through the substrate 210, the base insulating film 212 and the gate insulating film 213, it is preferable to use highly light-transmitting materials for all of them.

A PIN-type photoelectric conversion element 225 may be formed based on the description of the embodiment, and this example shows a brief description thereof. The photoelectric conversion element 225 shown in FIG. 9A includes a wiring 204, a p-type semiconductor layer 221$p$, an n-type semiconductor layer 221$n$, an intrinsic (i-type) semiconductor layer 221$i$ interposed between the p-type semiconductor layer 221$p$ and the n-type semiconductor layer 221$n$, which constitute the photoelectric conversion layer 221, and a terminal electrode 226.

The wiring 204 has a stacked structure of a high melting point metal film and a low resistance metal film (such as an aluminum alloy or pure aluminum). Here, the wiring 204 has a three-layer structure in which a titanium film (Ti film), an aluminum film (Al film) and a Ti film are stacked sequentially. When the wiring 204 is formed to have an end portion with a tapered shape, the distance between the wiring 204 and a top layer of the photoelectric conversion layer 221 i.e., the n-type semiconductor layer 221$n$ is increased in this example, and thus, a leakage current is prevented more effectively.

The wiring 204 may be formed a single layer of a conductive film. As such a single layer of a conductive film, a titanium film (Ti film) is preferable. Further, instead of the titanium (Ti) film, a single layer of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), or an alloy material or a compound material including such elements as its main component, or a nitride of such elements, such as titanium nitride, tungsten nitride, tantalum nitride or molybdenum nitride may be used.

The photoelectric conversion element 225 shown in FIG. 9B includes a protective electrode 218 over the wiring 204. Further, a protective electrode 272 over a source or drain electrode 202 of a TFT 231, a protective electrode 273 over a source or drain electrode 203 of a TFT 230, a protective electrode 271 over a terminal electrode 201, and a protective electrode 220 over a connection electrode 205 are formed.

In the photoelectric conversion element 225 shown in FIG. 9B, when the photoelectric conversion layer 221 is etched, the wiring 204 is protected by the protective electrode 218 covering the wiring 204. A material for the protective electrode 218 is preferably a conductive material whose etching rate is lower than the photoelectric conversion layer with respect to an etching gas (or an etchant) used for etching the photoelectric conversion layer 221. Additionally, a material for the protective electrode 218 is preferably a conductive material which does not react with the photoelectric conversion layer 221 to be an alloy. Protective electrodes 271, 272, 273 and 220 may be formed with the same material as the protective electrode 218.

Positional relations of the photoelectric conversion layer 221 and the wiring 204, and the photoelectric conversion layer 221, the wiring 204 and the protective electrode 218 may be referred to the description of Example 2, and the positional relations shown in FIGS. 3A, 3B and 16A, 1613 may be employed.

An amplifier circuit provided over the same substrate so as to amplify the output value of the PIN type photoelectric conversion element 225 is formed with a current mirror circuit 232 using n-channel thin film transistors (Thin Film Transistor (TFT)) 230 and 231.

Figure 10A:
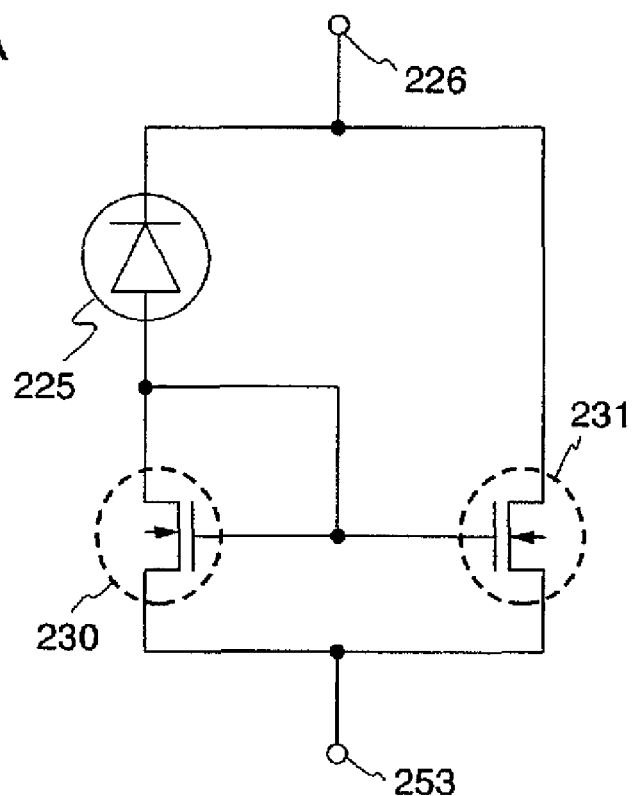
FIGS. 10A and 10B are equivalent circuit diagrams of devices incorporating a photoelectric conversion device of the present invention.
Figure 10B:
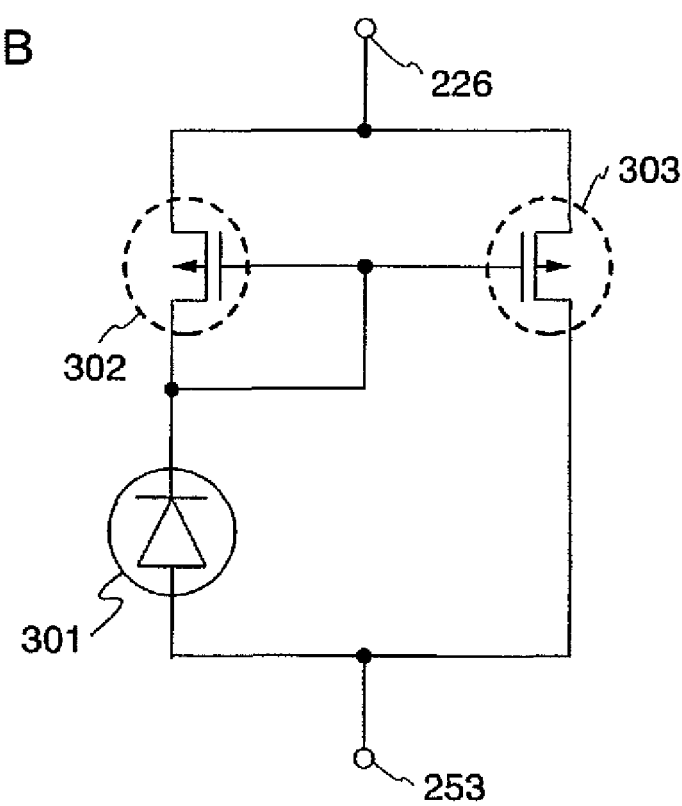

In addition, an equivalent circuit diagram of a visible light sensor with two terminals is shown in FIGS. 10A and 10B. FIG. 10A is an equivalent circuit diagram of the current mirror circuit using n-channel TFTs which is an amplifier circuit, and is an equivalent circuit diagram of FIGS. 9A and 9B.

FIG. 10B shows an equivalent circuit diagram in a case where the amplifier circuit is formed using a p-channel TFT.

In the case that the amplifier circuit is formed using p-channel TFTs in this way, the n-channel TFTs 230 and 231 shown in FIGS. 9A and 9B may be formed using p-channel TFTs 302 and 303.

In FIG. 10B, terminal electrodes 226 and 253 are the same as those of in FIG. 10A, which may be connected to p-channel TFTs 302 and 303 and a photoelectric conversion element 301, respectively as shown in FIG. 10B. The p-channel TFT 302 is electrically connected to an electrode on the anode side of the photoelectric conversion element 301. In the photoelectric conversion element 301, an n-type semiconductor layer, an intrinsic semiconductor layer (an i-type semiconductor layer), and a p-type semiconductor layer are stacked in this order over the electrode on the anode side connected to the p-channel TFT 302; and then, a first electrode (an electrode on the cathode side) may be formed. In addition, a photoelectric conversion element having a reverse stacking order may also used, in which a p-type semiconductor layer, an intrinsic semiconductor layer (an i-type semiconductor layer) and an n-type semiconductor layer are stacked in this order over the electrode on the cathode side; and then, an electrode on the anode side connected to the p-channel TFT 302 is formed, and a terminal electrode on the cathode side connected to the first electrode may be formed.

Two TFTs are illustrated in FIGS. 10A and 10B. However, for example, in order to increase the output value by five times, 2 pieces of the n-channel TFT 230 (channel-length (L) and channel width (W) are 8 μm and 50 μm, respectively) and 10 pieces of the n-channel TFT 231 (channel-length (L) and channel width (W) are 8 μm and 50 μm, respectively) may be provided.

Moreover, an example of providing a piece of the n-channel TFT 230 and 100 pieces of the n-channel TFT 231 in order to increase the output value by 100 times is shown in FIG. 11. It is to be noted that the same reference numerals as those in FIGS. 9A and 9B, and 10A are used for the same portions in FIG. 11. In FIG. 11, the n-channel TFT 231 includes 100 pieces of n-channel TFT 231a, 231b, 231c, 231d, . . . . In this manner, a photoelectric current generated in the photoelectric conversion element 225 is amplified by 100 times and outputted.

Further, an amplifier circuit for amplifying the output value may be formed by using an operational amplifier (op-amp) in which an n-channel TFT and a p-channel TFT are combined appropriately; however, the amplifier circuit has five terminals. Meanwhile, the number of power supplies can be reduced, and the amplifier circuit has four terminals by forming the amplifier circuit using an operational amplifier and by using a level shifter.

In addition, in FIGS. 9A and 9B, an example of a top gate TFT in which the n-channel TFTs 230 and 231 each include one channel formation region (referred to as "single gate structure" in the present specification) is shown; however, a structure including a plurality of channel formation regions (referred to as "multi-gate structure" in the present specification) may also be employed to reduce variation in ON current value. Further, the n-channel TFTs 230 and 231 may be provided with a low-concentration drain (Lightly Doped Drain (LDD)) region to reduce the OFF current value. An LDD region is a region doped with an impurity element at a low concentration between the channel formation region and a source region or drain region that is formed by adding an impurity element at a high concentration. When such an LDD region is provided, there is an advantageous effect that an electric field in the vicinity of a drain region is alleviated, thereby preventing deterioration due to hot carrier injection. In addition, in order to prevent deterioration in ON current value due to a hot carrier, the n-channel TFTs 230 and 231 may have a structure in which an LDD region is stacked over a gate electrode with a gate insulating film interposed therebetween (referred to as "GOLD (Gate-drain Overlapped LDD) structure" in the present specification).

In the case of using the GOLD structure, the effect of alleviating an electric field in the vicinity of a drain region, thereby preventing deterioration due to hot carrier injection is more advantageous than in the case where the LDD region is not overlapped with the gate electrode. It is effective to employ such a GOLD structure for preventing a deterioration phenomenon since an electric field intensity in the vicinity of a drain region is alleviated, thereby preventing hot carrier injection.

Further, the p-channel TFTs 302 and 303 in FIG. 10B may also have a similar structure to the n-channel TFTs 230 and 231, in other words, a single gate structure or a multigate structure, and an LDD region may be provided, as necessary.

In addition, the wiring 214 is a wiring connected to the wiring 204, and serves as a gate electrode, since the wiring 214 extends over a channel formation region of a TFT 230 of the amplifier circuit.

The wiring 226 is a wiring connected to the n-type semiconductor layer 221n, and is connected to a drain wiring (also referred to as a drain electrode) or a source wiring (also referred to as a source electrode) of the TFT 231. Reference numerals 216 and 217 denote insulating films, and reference numeral 205 denotes a connection electrode. Since received light passes through the insulating films 216 and 217, it is preferable to use a highly light-transmitting material for all of them. A silicon oxide film ($SiO_x$ film) formed by a CVD method is preferably used for the insulating film 217. When a silicon oxide film formed by a CVD method is used for the insulating film 217, fixing strength is improved.

In addition, a terminal electrode 250 is formed in the same step as the wirings 214 and 215, and a terminal electrode 201 is formed in the same step as the wiring 204 and the connection electrode 205.

In addition, a terminal electrode 226 is connected to the n-type semiconductor layer 221n, and mounted on an electrode 261 of a printed wiring board 260 with solder 264. In addition, a terminal electrode 253 is formed in the same step as the terminal electrode 226, and mounted on an electrode 262 of the printed wiring board 260 with solder 263.

Hereinafter, a manufacturing process to obtain the structure described above will be described with reference to FIGS. 12A to 12D, 13A to 13D and 14A to 14C.

First, an element is formed over a substrate (a first substrate 210). Here, AN 100 that is one of glass substrates is used as the substrate 210.

Figure 12A:
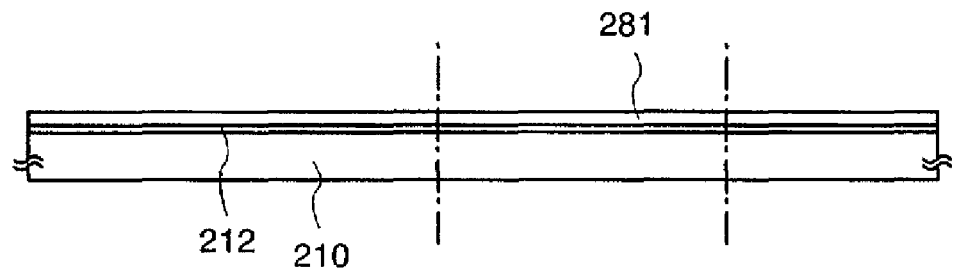
FIGS. 12A to 12D show manufacturing steps of a device on which a photoelectric conversion device of the present invention is mounted.

Subsequently, a silicon oxide film containing nitrogen which serves as a base insulating film 212 (100 nm thick) is formed by a plasma CVD method, and a semiconductor film 281 e.g., an amorphous silicon film containing hydrogen (54 nm thick) is stacked thereover without being exposed to air (FIG. 12A). In addition, a silicon oxide film, a silicon nitride film and a silicon oxide film containing nitrogen may be stacked to form the base insulating film 212. For example, a silicon nitride film containing oxygen of 50 nm thick, and further, a silicon oxide film containing nitrogen of 100 nm thick may be stacked to form the base insulating film 212. It is to be noted that the silicon oxide film containing nitrogen or the silicon nitride film serves as a blocking layer for preventing diffusion of impurities such as an alkali metal from a glass substrate.

Then, the amorphous silicon film is crystallized by using a known technique (such as a solid-phase growth method, a laser crystallization method, or a crystallization method using a catalyst metal) to form a semiconductor film having a crystal structure (a crystalline semiconductor film), for example, a polycrystal silicon film. Here, a polycrystal silicon film is obtained by a crystallization method using a catalyst element. A nickel acetate solution containing nickel of 10 ppm by weight is applied by a spinner. It is to be noted that a nickel element may be applied over the entire surface by a sputtering method instead of the application. Then, a heat treatment is conducted for crystallization to form a semiconductor film having a crystal structure (here, a polycrystal silicon film). Here, the polycrystal silicon film is obtained by a heat treatment for crystallization (at 550° C. for 4 hours) after a heat treatment (at 550° C. for 1 hour).

Next, an oxide film over the surface of the polycrystal silicon film is removed by a dilute hydrofluoric acid or the like. After that, laser irradiation (XeCl: wavelength of 308 nm) for raising a degree of crystallization and repairing a defect left in a crystal grain is performed in an atmospheric air or in an oxygen atmosphere.

Excimer laser light of a wavelength of 400 nm or less, or the second harmonic or the third harmonic of a YAG laser is used for the laser light. Here, pulsed laser light having a repetition rate of approximately 10 to 1000 Hz is used. The laser light may be condensed to 100 to 500 mJ/cm$^2$ by an optical system, and irradiation may be performed with an overlap rate of 90 to 95%, thereby scanning the silicon film surface. In this example, the irradiation of the laser light is performed in an atmospheric air with a repetition rate of 30 Hz and energy density of 470 mJ/cm$^2$.

It is to be noted that an oxide film is formed over the surface by the laser irradiation since the laser irradiation is conducted in an atmospheric air or in an oxygen atmosphere. Although an example of using the pulsed laser is shown in this example, a continuous wave laser may also be used. For crystallization of a semiconductor film, it is preferable that the second harmonic to the fourth harmonic of a fundamental wave be applied by using a continuous wave solid state laser in order to obtain a crystal with a large grain size. As a typical example, the second harmonic (532 nm) or the third harmonic (355 nm) of an Nd:YVO$_4$ laser (a fundamental wave of 1064 nm) may be applied.

In the case of using a continuous wave laser, laser light emitted from a continuous wave type YVO$_4$ laser of 10 W output is converted into harmonics by using a non-linear optical element. Further, a method of emitting harmonics by applying a YVO$_4$ crystal and the non-linear optical element into a resonator can also be given. Then, the laser light having a rectangular shape or an elliptical shape on an irradiated face is preferably formed by an optical system, and an object is irradiated with the laser light. At this time, the energy density of approximately 0.01 to 100 MW/cm$^2$ (preferably, 0.1 to 10 MW/cm$^2$) is required. The semiconductor film may be moved at approximately 10 to 2000 cm/s rate relatively to the laser light so as to be irradiated.

Then, in addition to the oxide film formed by the laser irradiation, a barrier layer made of an oxide film having a thickness of 1 to 5 nm in total is formed by treating the surface with ozone water for 120 seconds. The barrier layer is formed in order to remove a catalyst element, which is added for crystallization, such as nickel (Ni) from the film. The barrier layer is formed by using ozone water here. However, a barrier layer may also be formed by depositing an oxide film of approximately 1 to 10 nm thick by using a method of oxidizing a surface of a semiconductor film having a crystal structure by UV-ray irradiation in an oxygen atmosphere, a method of oxidizing a surface of a semiconductor film having a crystal structure by an oxygen plasma treatment, a plasma CVD method, a sputtering method, an evaporation method or the like. In addition, before forming the barrier layer, the oxide film formed by laser irradiation may be removed.

Then, over the barrier layer, an amorphous silicon film containing an argon element is formed to be 10 nm to 400 nm thick, for example, 100 nm thick here, by a sputtering method. Here, the amorphous silicon film containing an argon element is formed using a silicon target in an atmosphere containing argon. When a plasma CVD method is used to form the amorphous silicon film containing an argon element, the deposition condition is as follows: a flow ratio of monosilane to argon (SiH$_4$:Ar) is set to be 1:99; deposition pressure is set to be 6.665 Pa; the RF power density is set to be 0.087 W/cm$^2$; and a deposition temperature is set to be 350° C.

After that, a furnace heated to 650° C. is used for a heat treatment for three minutes to remove a catalyst element (gettering). By this treatment, the catalyst element concentration in the semiconductor film having a crystal structure is reduced. A lamp annealing apparatus may also be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. It is to be noted that there is a tendency that nickel is likely to move to a region with a high oxygen concentration in gettering, and thus, it is preferable that the barrier layer made of the oxide film be removed after gettering.

It is to be noted that, in the case where crystallization of a semiconductor film using a catalytic element is not performed, the above described steps such as the formation of the barrier layer, the formation of the gettering site, the heat treatment for gettering, the removal of the gettering site, and the removal of the barrier layer are not required.

Figure 12B:
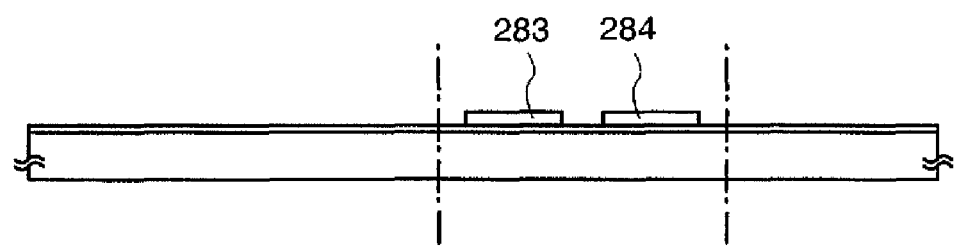

Then, after a thin oxide film is formed with ozone water on the surface of the obtained semiconductor film having a crystal structure (such as a crystalline silicon film), a mask made of resist is formed by using a first photomask, and an etching treatment is conducted to obtain a desired shape, thereby forming semiconductor films separated to have island shapes 283 and 284 (referred to as an island-shaped semiconductor region in the present specification) (FIG. 12B). After forming the island-shaped semiconductor regions 283 and 284, the mask made of resist is removed.

Subsequently, if necessary, doping of a slight amount of an impurity element (boron or phosphorus) is performed to control a threshold value of a TFT. Here, an ion doping method is used, in which diborane (B$_2$H$_6$) is not separated by mass but excited by plasma.

Next, the oxide film is removed with an etchant containing hydrofluoric acid, and at the same time, the surface of the island-shaped semiconductor film is washed. Then, an insulating film containing silicon as its main component, which serves as a gate insulating film 213, is formed. Here, a silicon oxide film containing nitrogen (composition ratio: Si=32%, O=59%, N=7%, H=2%) is formed to have a thickness of 115 nm by a plasma CVD method.

Figure 12C:
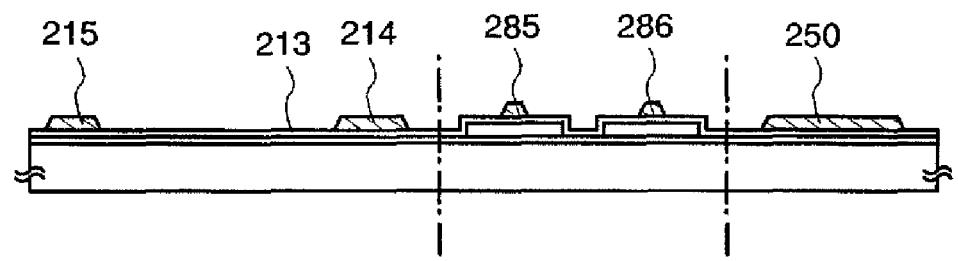

Then, after a metal film is formed over the gate insulating film 213, a second photomask is used to form gate electrodes 285 and 286, wirings 214 and 215, and a terminal electrode 250 (FIG. 12C). For example, as the metal film, a film which is formed by stacking tantalum nitride (TaN) and tungsten (W) to be 30 nm and 370 nm respectively is used.

In addition to the above described materials, as the gate electrodes 285 and 286, the wirings 214 and 215 and the terminal electrode 250, a single layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) or copper (Cu), or an alloy material or a compound material containing the element as its main component; or a single layer film made of nitride thereof, such as titanium nitride, tungsten nitride, tantalum nitride or molybdenum nitride, can be used.

Figure 12D:
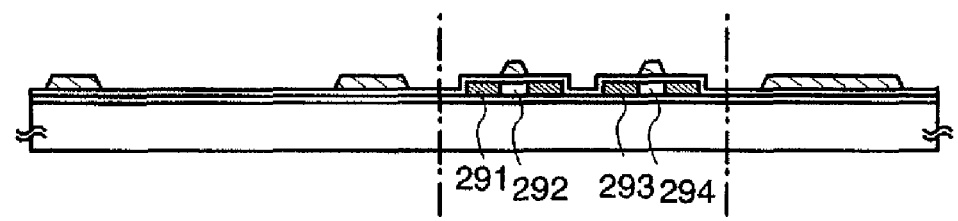

Then, doping to the island-shaped semiconductor regions 283 and 284 is performed to form a source region or drain region 291 of the TFT 230 and a source region or drain region 293 of the TFT 231 (FIG. 12D). In addition, in the TFT 231, a channel formation region 292 is formed between a source region and a drain region, and then, in the TFT 232, a channel formation region 294 is formed between a source region and a drain region.

Subsequently, after a first interlayer insulating film containing a silicon oxide film (not illustrated) is formed to be 50 nm thick by a CVD method, an activation step of an impurity element added to each island-shaped semiconductor region 283 and 284 is conducted. The activation step is conducted by a rapid thermal annealing method (RTA method) using a lamp light source, a method of irradiation of a YAG laser or an excimer laser from the back side, a heat treatment using a furnace, or a combination method of the foregoing methods.

Next, a second interlayer insulating film 216 including a silicon nitride film containing hydrogen and oxygen is formed to have a film thickness of, e.g. 10 nm.

Figure 13A:
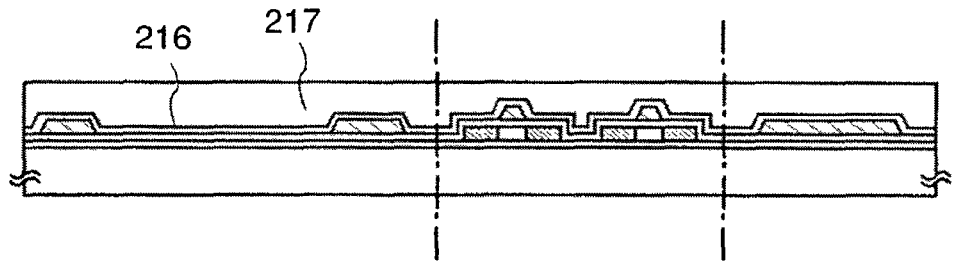
FIGS. 13A to 13D show manufacturing steps of a device on which a photoelectric conversion device of the present invention is mounted.
Figure 13B:
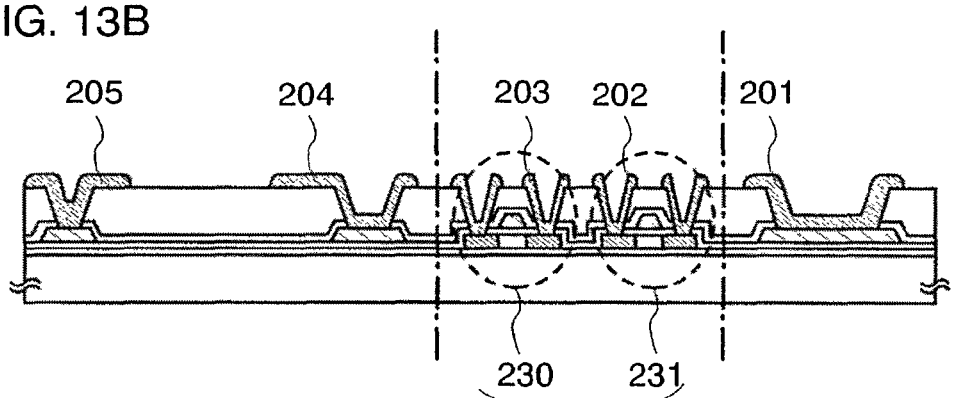

Subsequently, a third interlayer insulating film 217 made of an insulator material is formed over the second interlayer insulating film 216 (FIG. 13A). An insulating film obtained by a CVD method can be used for the third interlayer insulating film 217. In this example, in order to improve adhesion, a silicon oxide film containing nitrogen is formed to have a film thickness of 900 nm as the third interlayer insulating film 217.

Then, a heat treatment (a heat treatment at 300 to 550° C. for 1 to 12 hours, for example, at 410° C. for 1 hour in a nitrogen atmosphere) is conducted to hydrogenate the island-shaped semiconductor regions 283 and 284. This step is conducted to terminate dangling bonds in the island-shaped semiconductor regions 283 and 284 by hydrogen contained in the second interlayer insulating film 216. The island-shaped semiconductor regions can be hydrogenated regardless of existence of the gate insulating film 213.

In addition, as the third interlayer insulating film 217, an insulating film using siloxane and a stacked structure thereof can also be used. A skeleton structure of siloxane includes a bond of silicon (Si) and oxygen (O). As a substituent, a compound containing at least hydrogen (such as an alkyl group or an aromatic hydrocarbon) can be used. Fluorine may also be used as a substituent. Moreover, a compound containing at least hydrogen and fluorine may be used as a substituent.

When an insulating film using siloxane or a stacked structure thereof is used as the third interlayer insulating film 217, it is possible that after forming the second interlayer insulating film 216, a heat treatment for hydrogenating the island-shaped semiconductor regions 283 and 284 may be conducted, and then, the third interlayer insulating film 217 can be formed.

Then, a mask made of resist is formed by using a third photomask, and the first interlayer insulating film, the second interlayer insulating film 216, and the third interlayer insulating film 217, and the gate insulating film 213 are selectively etched to form contact holes. Then, the mask made of resist is removed.

It is to be noted that the third interlayer insulating film 217 may be formed if necessary. When the third interlayer insulating film 217 is not formed, after forming the second interlayer insulating film 216, the first interlayer insulating film, the second interlayer insulating film 216, and the gate insulating film 213 are selectively etched to form contact holes.

Subsequently, after forming metal stacked films by a sputtering method, a mask made of resist is formed by using a fourth photomask, and then, the metal film is selectively etched to form the wiring 204, the connection electrode 205, the terminal electrode 201, a source electrode or drain electrode 203 of the TFT 230, and a source electrode or drain electrode 202 of the TFT 231. Then, the mask made of resist is removed. It is to be noted that the metal stacked films of this example have a stacked structure of three layers of a Ti film of 100 nm thick, an Al film containing a slight amount of Si of 350 nm thick, and a Ti film of 100 nm thick.

The wiring 204, the connection electrode 205, the terminal electrode 201, the source electrode or drain electrode 202 of the TFT 231, the source electrode or drain electrode 203 of the TFT 230 are formed using a single layer conductive film. As such a conductive film, a titanium film (Ti film) is preferably used. In addition, instead of the titanium film, a single layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), or an alloy material or a compound material containing the element as its main component; or a single layer film made of nitride thereof, such as titanium nitride, tungsten nitride, tantalum nitride or molybdenum nitride can be used. By forming the wiring 204, the connection electrode 205, the terminal electrode 201, the source electrode or drain electrode 202 of the TFT 231, and the source electrode or drain electrode 203 of the TFT 230 with a single layer film, the number of film formation can be reduced in manufacturing steps.

Figure 13C:
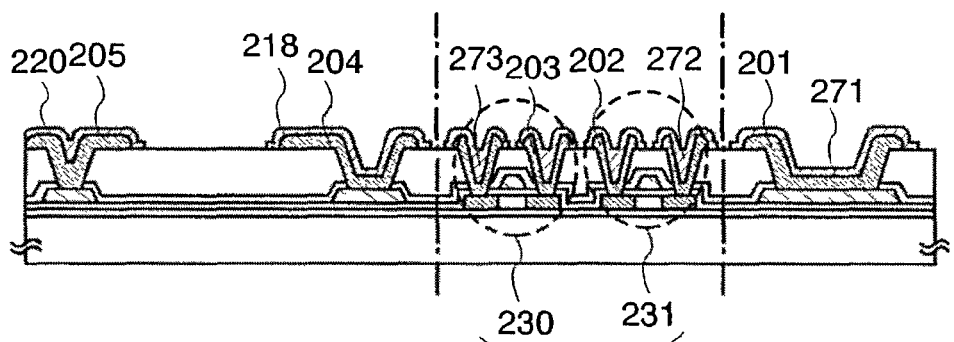
Figure 13D:
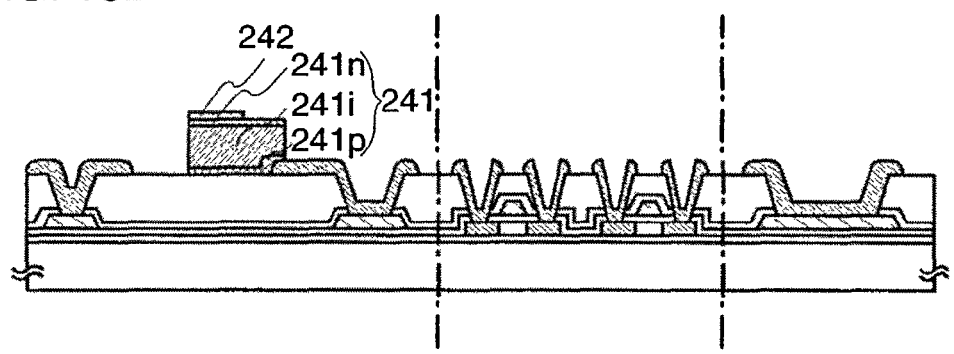

FIG. 13C shows an example in which protective electrodes 218, 220, 271, 273, and 272 are formed over the wiring 204, the connection electrode 205, the terminal electrode 201, the source or drain electrode 203 of the TFT 230, and the source or drain electrode 202 of the TFT 231.

The protective electrode 218 can protect the wiring 204 when the photoelectric conversion layer is etched in a later step. Thus, as a material of the protective electrode 218, it is preferable to use a conductive material whose etching rate to a gas (or etchant) for etching the photoelectric conversion layer is smaller than the photoelectric conversion layer. Additionally, a material of the protective electrode 218 is preferably a conductive material (such as titanium (Ti) or molybdenum (Mo)) which does not react with the photoelectric conversion layer to form an alloy.

By using the protective electrodes 218, 220, 271, 273, and 272, when the wiring 204, the connection electrode 205, the terminal electrode 201, the source electrode or drain electrode 202 of the TFT 231, and the source electrode or drain electrode 203 of the TFT 230 are formed with stacked films, for example, a three-layer stacked structure of a titanium (Ti) film, an aluminum (Al) film and a titanium (Ti) film, this is an advantageous effect that an exposed side of the Al film as the second layer can be covered, and diffusion of an aluminum atom into the photoelectric conversion layer can be prevented.

In the above-mentioned step, the top gate TFTs 230 and 231 using a polycrystal silicon film can be manufactured. A current mirror circuit 232 is formed using the TFTs 230 and 231.

Subsequently, the photoelectric conversion layer 241 is formed. The photoelectric conversion layer 241 may be formed based on the descriptions of the Embodiment and the Examples 1 to 3.

The photoelectric conversion layer 241 includes the p-type semiconductor layer 241p, the i-type semiconductor layer 241i and the n-type semiconductor layer 241n. The p-type semiconductor layer 241p, the i-type semiconductor layer 241i and the n-type semiconductor layer 241n may each be formed using an amorphous silicon film, for example. In this example, the p-type semiconductor layer 241p is formed to have a thickness of 10 to 50 nm, the i-type semiconductor layer 241i is formed to have a thickness of 200 to 1000 nm and the n-type semiconductor layer 241n is formed to have a thickness of 20 to 200 nm.

An insulating film 242 is formed over the photoelectric conversion layer 241. The insulating film 242 may be formed in the same manner as the insulating film 175 shown in Embodiment.

The photoelectric conversion layer 241 is etched using the insulating film 242 as a mask. At this time, the time for etching is adjusted such that the n-type semiconductor layer in the top layer is etched, but the p-type semiconductor layer 241p in the lower layer is not etched. The i-type semiconductor layer 241i is formed to be thick such that the etching stops in the i-type semiconductor layer in the middle layer. After the etching of the photoelectric conversion layer 241 is finished, the insulating film 242 is removed.

Figure 14A:
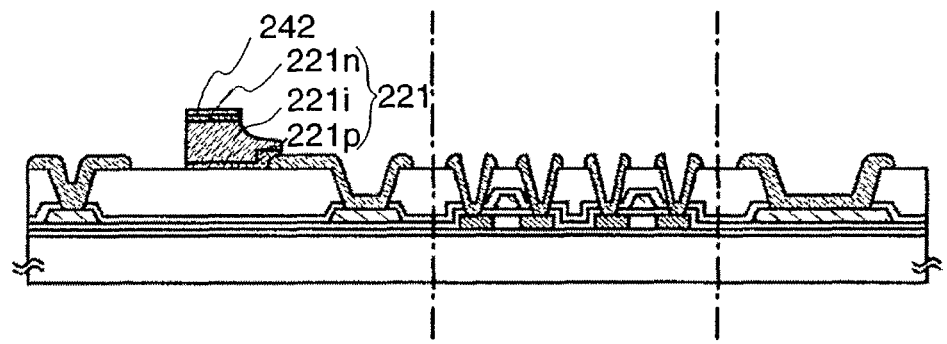
FIGS. 14A to 14C show manufacturing steps of a device on which a photoelectric conversion device of the present invention is mounted.

By this etching step, a part of the n-type semiconductor layer 241n and a part of the i-type semiconductor layer 241i is removed to obtain a shape shown by 221n and 221i, (FIG. 14A). In addition, since the p-type semiconductor layer 241p is not etched, the same shape (221p) is left. In this manner, the photoelectric conversion layer 221 including the p-type semiconductor layer 221p and the i-type semiconductor layer 221i and the n-type semiconductor layer 221n is formed.

Figure 14B:
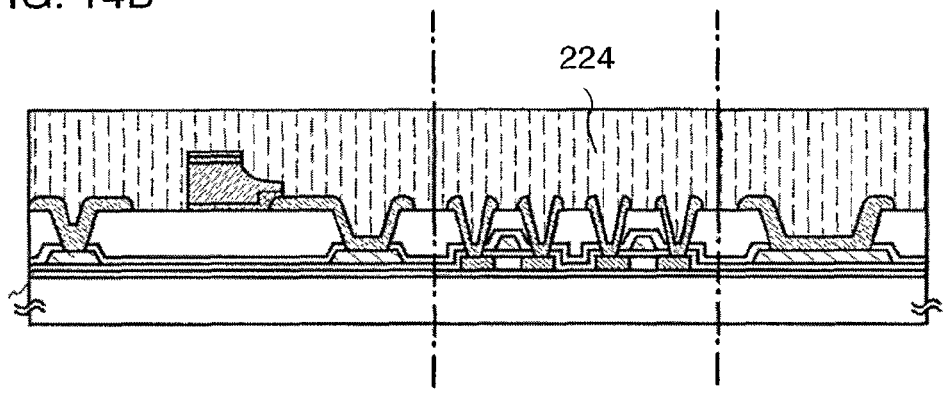

Then, a sealing layer 224 including an insulator material (for example, an inorganic insulating film containing silicon) is formed to have a thickness of 1 to 30 μm over the entire surface, and a state of FIG. 14B is obtained. Here, a silicon oxide film containing nitrogen of 1 μm thick is formed by a CVD method as the insulator material film. At this time, adhesion is attempted to be improved by using the insulating film formed by a CVD method.

Next, after the sealing layer 224 is etched to provide an opening portion, the terminal electrodes 226 and 253 are formed by a sputtering method. The terminal electrodes 226 and 253 are made with a stacked structure of a titanium film (Ti film, 100 nm thick), a nickel film (Ni film, 300 nm thick), and a gold film (Au film, 50 nm thick). The fixing strength of the terminal electrodes 226 and 253 obtained in this manner is more than 5N, which is a sufficient fixing strength for the terminal electrode.

Figure 14C:
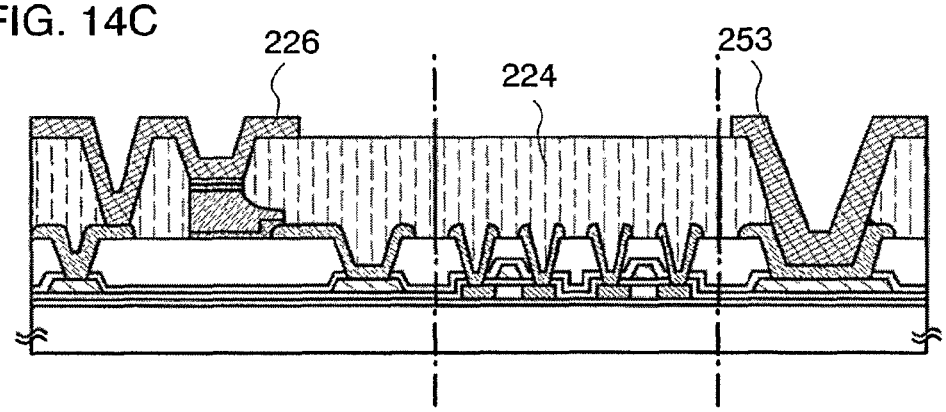

In the above described steps, the terminal electrodes 226 and 253 that can be connected with solder are formed, and a structure shown in FIG. 14C is obtained.

Subsequently, a plurality of photo-sensor chips are cut out by cutting the substrate into pieces. A large number of photo-sensor chips (2 mm×1.5 mm) can be manufactured from one large-area substrate (for example, 600 cm×720 cm).

Figure 15A:
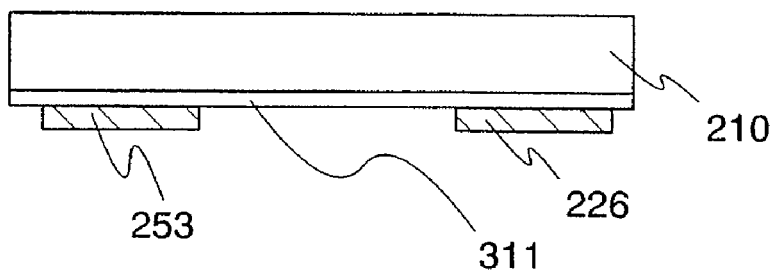
FIGS. 15A to 15C are a top view and side views of a device on which a photoelectric conversion device of the present invention is mounted.
Figure 15B:
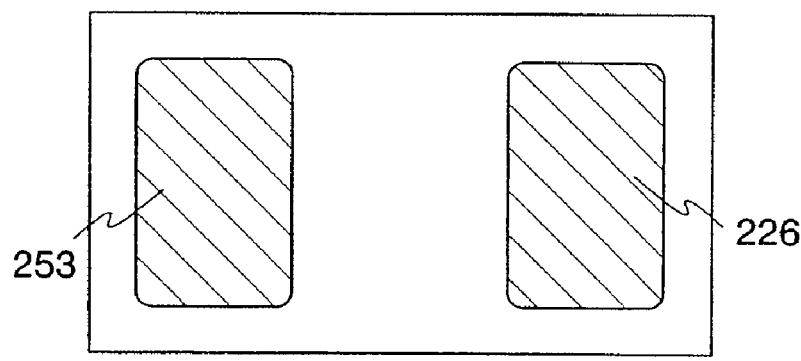
Figure 15C:
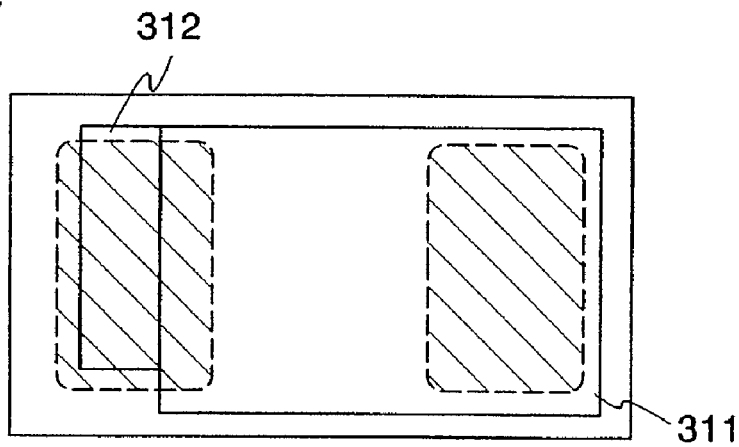

A cross-sectional view of one photo-sensor chip (2 mm×1.5 mm in a top view) that is cut out is shown in FIG. 15A, a bottom view thereof is shown in FIG. 15B, and the top view thereof is shown in FIG. 15C. In FIGS. 15A to 15C, the same reference numerals as in FIGS. 13A to 13D, and 14A to 14C are used for the same portions. It is to be noted that, in FIG. 15A, a total film thickness of the substrate 210, an element formation region 311 provided with a photoelectric conversion element, the terminal electrodes 226 and 253 in total is 0.8±0.05 mm.

In addition, in order to make the total film thickness of the photo-sensor chip thinner, a plurality of photo-sensor chips may be cut out by cutting the substrate into pieces using a dicer after the substrate 210 is ground and thinned by CMP or the like.

In FIG. 15B, the electrode size of one of the terminal electrodes 226 and 253 is 0.6 mm×1.1 mm, and the electrode interval is 0.4 mm. In addition, in FIG. 15C, the area of a light receiving portion 312 is 1.57 mm². Further, an amplifier circuit portion is provided with approximately 100 TFTs.

Finally, the obtained photo-sensor chip is mounted on the mounting side of the printed wiring board 260. Solder 264 and 263 are used for a connection between the terminal electrode 226 and the electrode 261, and a connection between the terminal electrode 253 and the electrode 262, respectively. The solder are formed in advance by a screen printing method or the like over the electrodes 261 and 262 of the printed wiring board 260, and the solder and the terminal electrode are made in contact with each other to mount them by a reflow soldering process. The reflow soldering process is conducted, for example, at approximately 255° C. to 265° C. for about 10 seconds in an inert gas atmosphere. Further, in addition to the solder, a bump made of a metal (such as gold or silver) or a bump made of a conductive resin or the like can be used. In addition, lead-free solder may also be used for mounting in consideration of an environmental problem.

FIGS. 9A and 9B show the photo-sensor chip mounted through the above-described steps. In the photo-sensor of the present invention (a circuit-integration type photo-sensor provided with an amplifier circuit capable of increasing an output value by 100 times), a photoelectric current of approximately 10 μA can be obtained at illuminance of 100 lux. In addition, in the photo-sensor of the present invention, a sensitivity wavelength range is 350 to 750 nm, and a peak sensitivity wavelength is 580 nm. Further, a dark current (Vr=5V) is 1000 pA.

This example can be combined with any descriptions of the Embodiment and the Examples 1 to 4.

Example 6

In Example 6, examples of various electronic devices in which a photoelectric conversion device obtained by the present invention is incorporated will be described. As electronic devices to which the present invention is applied, computers, displays, cellular phones, television receivers and the like are given. Specific examples of such electronic devices are shown in FIGS. 18A, 18B, 19A and 19B, 20, 21A and 21B.

Figure 17:
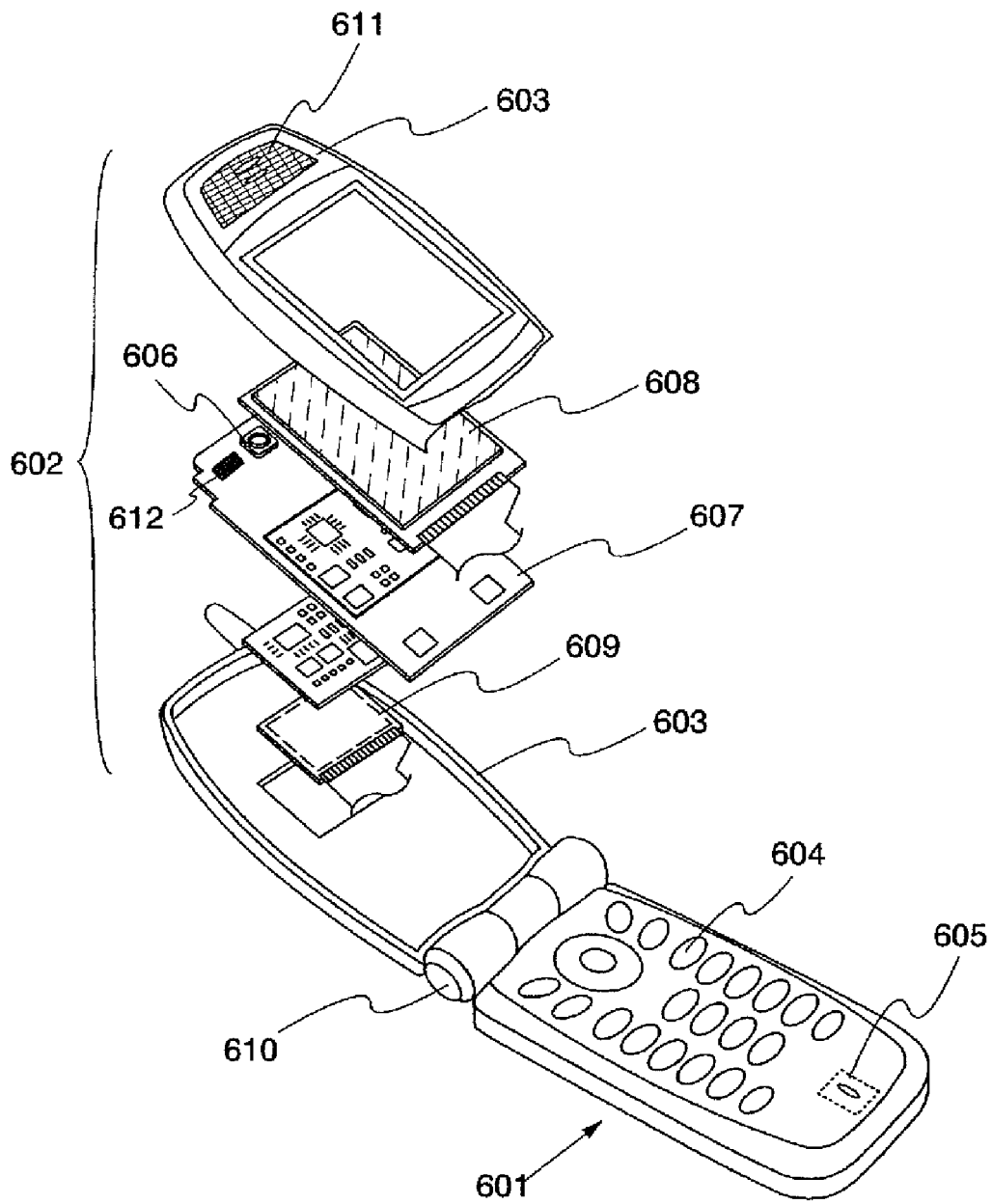
FIG. 17 shows an example of an electronic device incorporating a photoelectric conversion device of the present invention.

FIG. 17 shows a cellular phone, which includes a main body (A) 601, a main body (B) 602, a chassis 603, operation keys 604, a sound input portion 605, a sound output portion 606, a circuit board 607, a display panel (A) 608, a display panel (B) 609, a hinge 610, a light transmitting material portion 611, and a photo-sensor 612. The present invention can be applied to the photo-sensor 612.

The photo-sensor 612 detects light which have passed through the light transmitting material portion 611, and controls luminance of the display panel (A) 608 and the display panel (B) 609 depending on the illuminance of the detected extraneous light, or controls illumination of the operation keys 604 based on the illuminance obtained by the photo-sensor 612. In this manner, current consumption of the cellular phone can be suppressed.

Figure 18A:
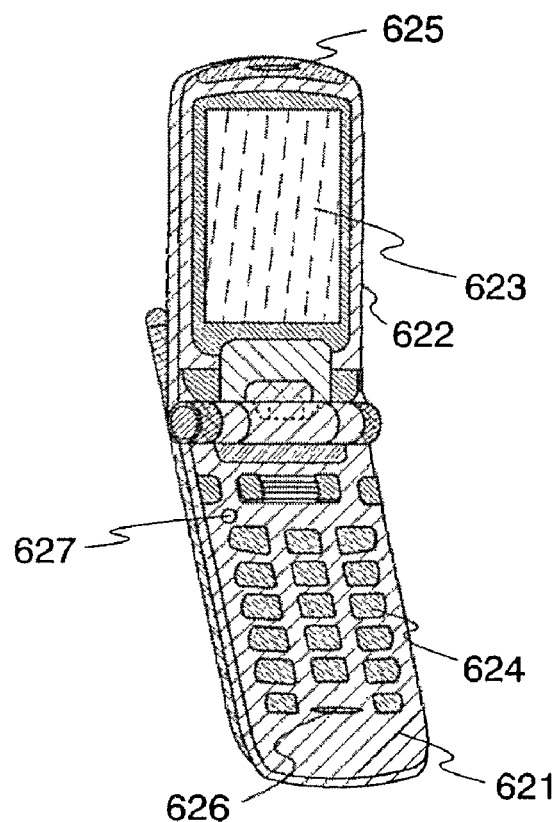
FIGS. 18A and 18B show an example of an electronic device incorporating a photoelectric conversion device of the present invention.
Figure 18B:
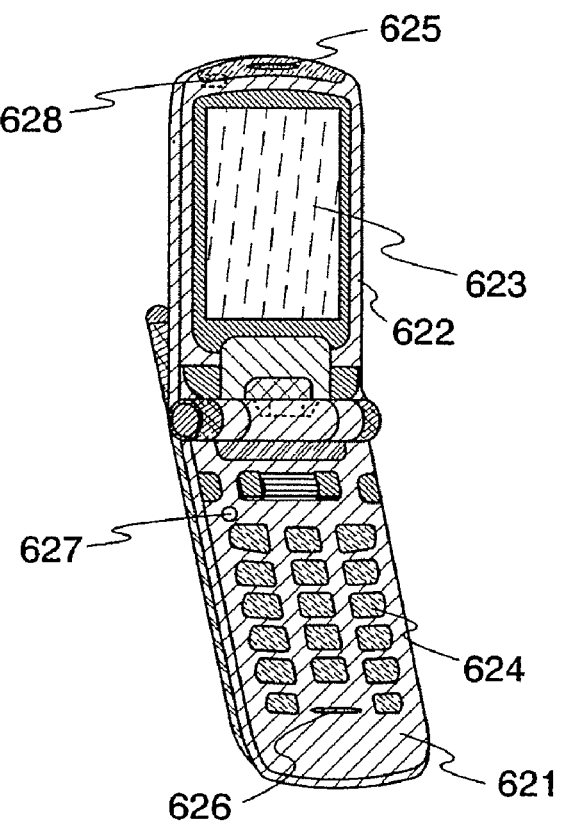

FIGS. 18A and 18B show other examples of a cellular phone. In FIGS. 18A and 18B, reference numeral 621 denotes a main body; 622, a chassis; 623, a display panel; 624, operation keys; 625, a sound output portion; 626, a sound input portion; and 627 and 628, photo-sensor portions.

In the cellular phone shown in FIG. 18A, luminance of the display panel 623 and the operation keys 624 can be controlled by detecting extraneous light by the photo-sensor portion 627 provided in the main body 621.

Furthermore, in the cellular phone shown in FIG. 18B, a photo-sensor portion 628 is provided inside the main body 621 in addition to the structure of FIG. 18A. By the photo-sensor portion 628, luminance of a back light that is provided in the display panel 623 can also be detected.

Figure 19A:
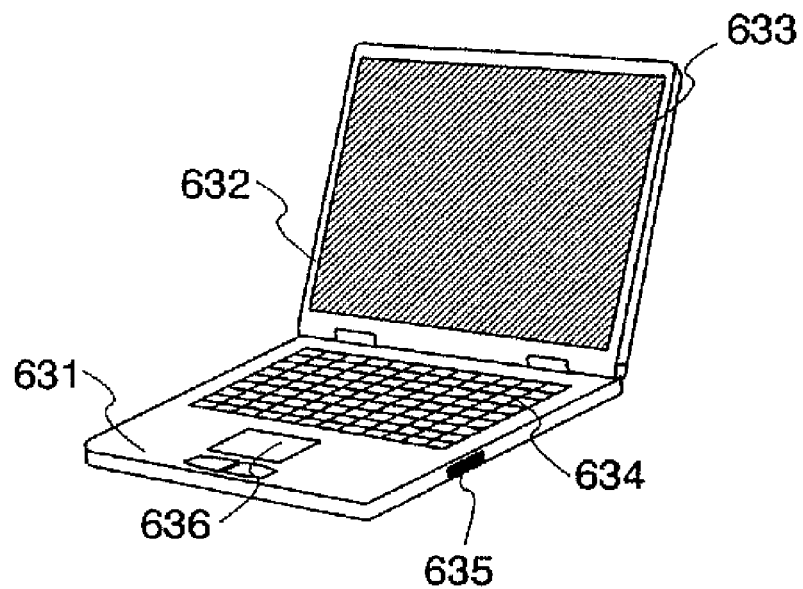
FIGS. 19A and 19B each show an example of an electronic device incorporating a photoelectric conversion device of the present invention.

FIG. 19A shows a computer, which includes a main body 631, a chassis 632, a display portion 633, a keyboard 634, an external connection port 635, a pointing mouse 636 and the like.

Figure 19B:
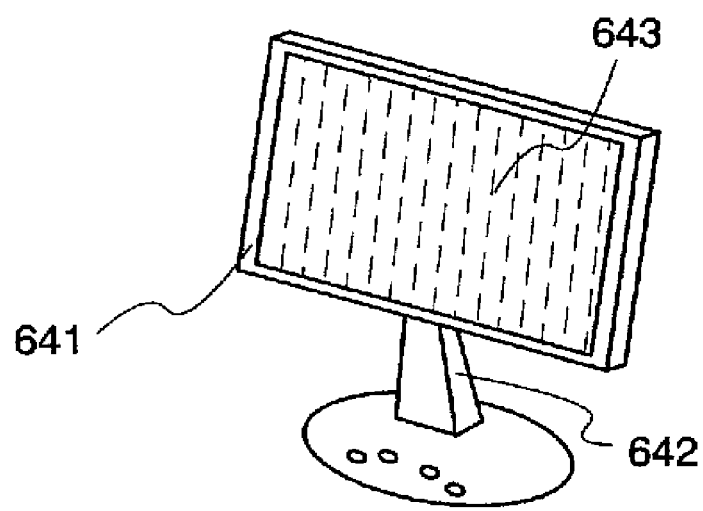

In addition, FIG. 19B shows a display device such as a television receiver. The display device includes a chassis 641, a support 642, a display portion 643 and the like.

A detailed structure of cases where liquid crystal panels are used for the display portion 633 of the computer shown in FIG. 19A and the display portion 643 of the display device shown in FIG. 19B is shown in FIG. 20.

A liquid crystal panel 662 shown in FIG. 20 is built in the chassis 661, and includes substrates 651a and 651b, a liquid crystal layer 655 interposed between the substrates 651a and 651b, polarizing filters 652a and 652b, a back light 653 and the like. In addition, a photo-sensor portion 654 is formed in the chassis 661.

The photo-sensor portion 654 manufactured by using the present invention detects the amount of light from the back light 653, and the information is fed back to adjust luminance of the liquid crystal panel 662.

Figure 21A:
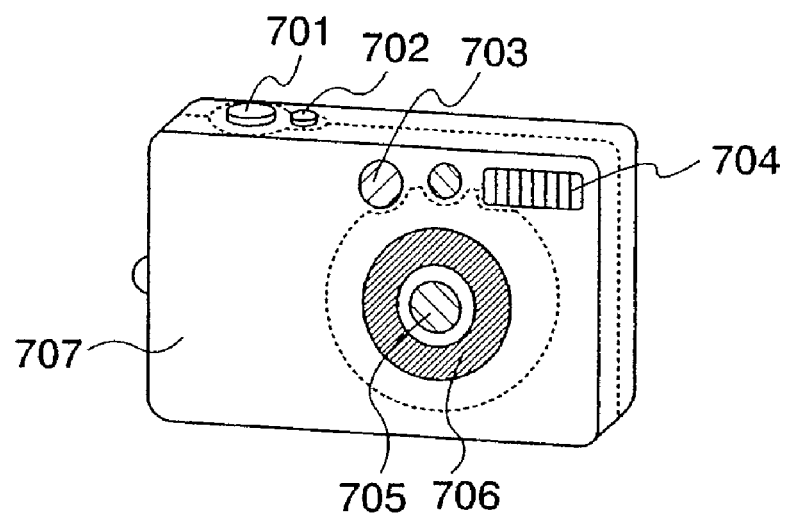
FIGS. 21A and 21B show an example of an electronic device incorporating a photoelectric conversion device of the present invention.
Figure 21B:
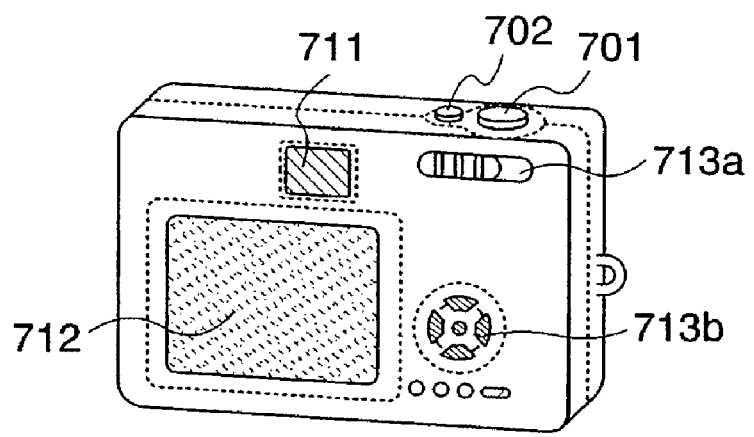
Figure 22A:
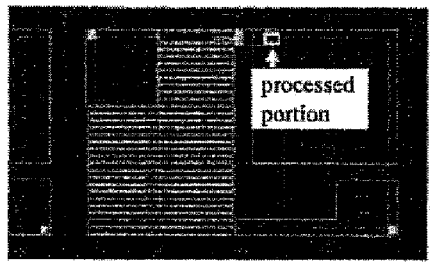
FIGS. 22A to 22C are photographs of a conventional structure obtained by an electronic microscope.
Figure 22B:
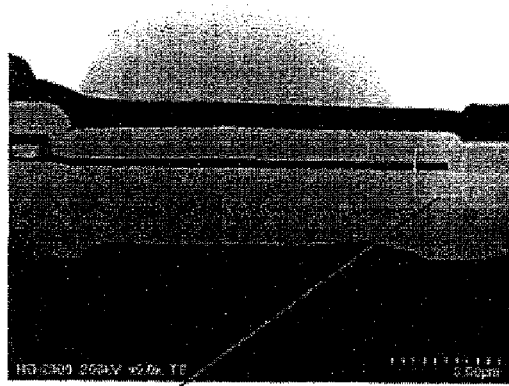
Figure 22C:
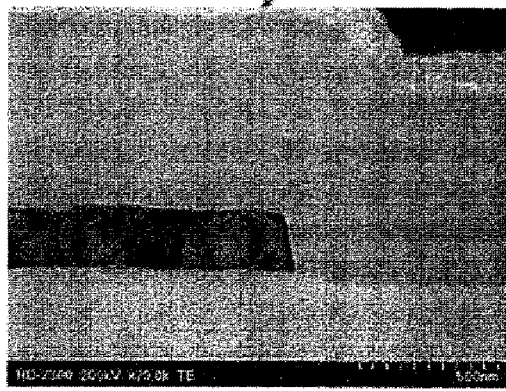

FIGS. 21A and 21B are drawings illustrating an example in which a photoelectric conversion device of the present invention is incorporated in a camera, for example, a digital camera. FIG. 21A is a perspective view seen from the front side of the digital camera, and FIG. 21B is a perspective view seen from the back side thereof. In FIG. 21A, a digital camera is provided with a release button 701, a main switch 702, a viewfinder 703, a flash portion 704, a lens 705, a barrel 706, and a chassis 707.

In addition, in FIG. 21B, the digital camera is provided with an eyepiece finder 711, a monitor 712, and operation buttons 713a and 713b.

When the release button 701 is pushed down to the half point, a focus adjustment mechanism and an exposure adjustment mechanism are operated, and when the release button is pushed down to the lowest point, a shutter is opened.

By pushing down or rotating the main switch 702, a power supply of the digital camera is switched on or off.

The viewfinder 703 is located in the upper position of the lens 705 which is on the front side of the digital camera, for checking a shooting range and the focus point from the eyepiece finder 711 shown in FIG. 21B.

The flash portion 704 is located in the upper position on the front side of the digital camera. When the subject brightness is not enough, auxiliary light is emitted from the flash portion 704, at the same time as the release button is pushed down and a shutter is opened.

The lens 705 is located at the front side of the digital camera, and formed from a focusing lens, a zoom lens and the like. The lens forms a photographic optical system with a shutter and a diaphragm which are not illustrated. In addition, behind the lens, an imaging device such as a CCD (Charge Coupled Device) is provided.

The barrel 706 moves a lens position to adjust the focus of the focusing lens, the zoom lens and the like. In shooting, the barrel is slid out to move the lens 705 forward. Further, when carrying it, the lens 705 is moved backward to be compact. It is to be noted that a structure is employed in the present example, in which the object can be photographed by zoom by sliding out the barrel; however, the present invention is not limited to this structure, and a structure may also be employed for the digital camera, in which shooting can be conducted by zoom without sliding out the barrel with use of a structure of a photographic optical system inside the chassis 707.

The eyepiece finder 711 is located in the upper position on the back side of the digital camera for looking therethrough when checking a shooting range and the focus point.

The operation buttons 713a and 713b are each a button for various functions provided on the back side of the digital camera, and formed with a set up button, a menu button, a display button, a functional button, a selecting button and the like.

When a photoelectric conversion device of the present invention is incorporated in the camera shown in FIGS. 21A and 21B, the photoelectric conversion device can detect whether light exists or not, and the light intensity; and thus, an exposure adjustment of a camera or the like can be conducted.

In addition, a photoelectric conversion device of the present invention can also be applied to other electronic devices such as a projection TV and a navigation system. In other words, it can be applied to any electronic device as long as it needs to detect light.

This example can be freely combined with any description of Embodiment and Examples 1 to 5.

In accordance with the present invention, by preventing an electric field from concentrating on a step portion, a photoelectric conversion device in which a leakage current can be suppressed can be manufactured. Further, by incorporating a photoelectric conversion device of the present invention, a highly reliable electronic device can be obtained.

The present application is based on Japanese Patent Application serial No. 2005-148583 filed on May 20, 2005 in Japanese Patent Office, the entire contents of which are hereby incorporated by reference.

What is claimed is:

1. A manufacturing method of a photoelectric conversion device, the method comprising:
   forming a first electrode over a substrate;
   forming a first semiconductor film having one conductivity over the first electrode;
   forming a second semiconductor film over the first semiconductor film;
   forming a third semiconductor film having a conductivity opposite to the one conductivity over the second semiconductor film;
   forming a first island-shaped semiconductor film, a second island-shaped semiconductor film over the first island-shaped semiconductor film, and a third island-shaped semiconductor film over the second island-shaped semiconductor film by removing a part of the first semiconductor film, the second semiconductor film, and the third semiconductor film to expose a part of the first electrode, wherein an end portion of the first electrode is covered by the first island-shaped semiconductor film; and
   removing a part of the second island-shaped semiconductor film and a part of the third island-shaped semiconductor film.

2. The manufacturing method of a photoelectric conversion device according to claim 1, the method further comprising:
   forming a second electrode over the third semiconductor film,
   wherein the second electrode is used as a mask in the step of removing the part of the second island-shaped semiconductor film and the part of the third island-shaped semiconductor film.

3. The manufacturing method of a photoelectric conversion device according to claim 1, the method further comprising:

forming an insulating film over the third semiconductor film, wherein the insulating film is used as a mask in the step of removing the part of the second island-shaped semiconductor film and the part of the third island-shaped semiconductor film; and forming a second electrode over the insulating film, the second electrode being electrically connected to the third island-shaped semiconductor film through the insulating film.

4. The manufacturing method of a photoelectric conversion device according to claim 1, wherein the substrate is a flexible substrate.

5. The manufacturing method of a photoelectric conversion device according to claim 4, wherein the flexible substrate is one of a polyethylenenaphthalate (PEN) film, a polyethyleneterephthalate (PET) film, a polybutylenenaphthalate (PBN) film, a polyimide (PI) film, or a polyamide (PA) film.

6. The manufacturing method of a photoelectric conversion device according to claim 1, wherein the substrate is a glass substrate.

7. The manufacturing method of a photoelectric conversion device according to claim 1, wherein a color filter is provided between the substrate and the first semiconductor film.

8. A manufacturing method of a photoelectric conversion device, the method comprising:

forming a first electrode over a substrate;

forming a first semiconductor film having one conductivity over the first electrode;

forming a second semiconductor film over the first semiconductor film, forming a third semiconductor film having a conductivity opposite to the one conductivity over the second semiconductor film;

forming a first island-shaped semiconductor film, a second island-shaped semiconductor film over the first island-shaped semiconductor film, and a third island-shaped semiconductor film over the second island-shaped semiconductor film by removing a part of the first semiconductor film, the second semiconductor film, and the third semiconductor film; and forming a second electrode over the third semiconductor film;

removing a part of the second island-shaped semiconductor film and a part of the third island-shaped semiconductor film so that the photoelectric conversion device has a first structure and a second structure, wherein the first structure includes the first electrode over the substrate the first semiconductor film over the first electrode, and the second semiconductor film over the first semiconductor film, wherein the second structure includes the first semiconductor film over the substrate, the second semiconductor film over the first semiconductor film, the third semiconductor film over the second semiconductor film and the second electrode over the third semiconductor film, and wherein the first electrode does not overlap the third island-shaped semiconductor film after removing the part of the second island-shaped semiconductor film and the part of the third island-shaped semiconductor film.

9. The manufacturing method of a photoelectric conversion device according to claim 8, wherein the substrate is a flexible substrate.

10. The manufacturing method of a photoelectric conversion device according to claim 9, wherein the flexible substrate is one of a polyethylenenaphthalate (PEN) film, a polyethyleneterephthalate (PET) film, a polybutylenenaphthalate (PBN) film, a polyimide (PI) film, or a polyamide (PA) film.

11. The manufacturing method of a photoelectric conversion device according to claim 8, wherein the substrate is a glass substrate.

12. The manufacturing method of a photoelectric conversion device according to claim 8, wherein a color filter is provided between the substrate and the first semiconductor film.

13. A manufacturing method of a photoelectric conversion device, the method comprising:

forming a first electrode over a substrate;

forming a first semiconductor film having one conductivity, a second semiconductor film, and a third semiconductor film having a conductivity opposite to the one conductivity over the first electrode;

forming a first conductive film over the third semiconductor film;

forming a first island-shaped semiconductor film, a second island-shaped semiconductor film, a third island-shaped semiconductor film, and a first island-shaped conductive film by removing a part of the first semiconductor film, the second semiconductor film, the third semiconductor film, and the first conductive film to expose a part of the first electrode;

forming a second conductive film by removing a part of the first island-shaped conductive film;

removing a part of the second island-shaped semiconductor film and the third semiconductor film using the second conductive film as a mask;

forming an insulating film to cover the first electrode which is exposed, the first island-shaped semiconductor film, the second island-shaped semiconductor film, the third island-shaped semiconductor film;

forming a first groove and a second groove in the insulating film, wherein the first groove reaches the first electrode and the second groove reaches the second conductive film; and forming a second electrode and a third electrode over the insulating film, which are electrically connected to the first electrode and the second electrode respectively through the first groove and the second groove.

14. The manufacturing method of a photoelectric conversion device according to claim 13, wherein the substrate is a flexible substrate.

15. The manufacturing method of a photoelectric conversion device according to claim 14, wherein the flexible substrate is one of a polyethylenenaphthalate (PEN) film, a polyethyleneterephthalate (PET) film, a polybutylenenaphthalate (PBN) film, a polyimide (PI) film, or a polyamide (PA) film.

16. The manufacturing method of a photoelectric conversion device according to claim 13, wherein the substrate is a glass substrate.

17. The manufacturing method of a photoelectric conversion device according to claim 13, wherein a color filter is provided between the substrate and the first semiconductor film.

* * * * *

UNITED STATES PATENT AND TRADEMARK OFFICE
CERTIFICATE OF CORRECTION

PATENT NO. : 8,138,004 B2
APPLICATION NO. : 12/821201
DATED : March 20, 2012
INVENTOR(S) : Yuusuke Sugawara et al.

Page 1 of 1

Figure 6B:
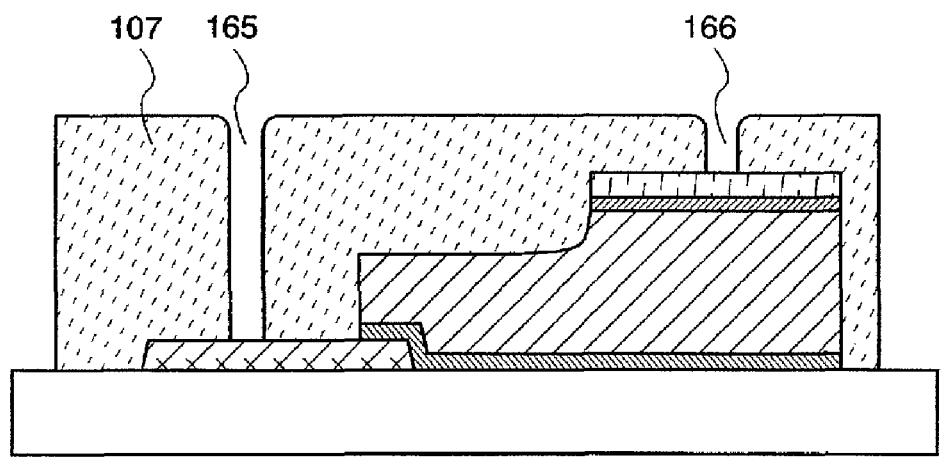

It is certified that error appears in the above-identified patent and that said Letters Patent is hereby corrected as shown below:

Column 6, line 1, replace "polyimide (PA)" with --polyamide (PA)--;

Column 8, line 2, replace "(FIG. 6B." with --(FIG. 6B).--;

Column 12, line 53, replace "1613" with --16B--.

Signed and Sealed this
Sixth Day of November, 2012

David J. Kappos
*Director of the United States Patent and Trademark Office*